United States Patent
Jongsma et al.

(10) Patent No.: US 7,046,180 B2
(45) Date of Patent: May 16, 2006

(54) ANALOG-TO-DIGITAL CONVERTER WITH RANGE ERROR DETECTION

(75) Inventors: Jonathon Michael Jongsma, Minneapolis, MN (US); Garrie David Huisenga, Chaska, MN (US)

(73) Assignee: Rosemount Inc., Eden Prairie, MN (US)

(*) Notice: Subject to any disclaimer, the term of this patent is extended or adjusted under 35 U.S.C. 154(b) by 131 days.

(21) Appl. No.: 10/829,124

(22) Filed: Apr. 21, 2004

(65) Prior Publication Data

US 2005/0248477 A1 Nov. 10, 2005

(51) Int. Cl.
*H03M 1/00* (2006.01)

(52) U.S. Cl. .................................................. 341/141
(58) Field of Classification Search ............... 341/118, 341/120, 141
See application file for complete search history.

(56) References Cited

U.S. PATENT DOCUMENTS

| | | | |
|---|---|---|---|
| 3,096,434 A | 7/1963 | King | 235/151 |
| 3,404,264 A | 10/1968 | Kugler | 235/194 |
| 3,468,164 A | 9/1969 | Sutherland | 73/343 |
| 3,590,370 A | 6/1971 | Fleischer | 324/51 |
| 3,618,592 A | 11/1971 | Stewart | 128/2.05 R |
| 3,688,190 A | 8/1972 | Blum | 324/61 R |
| 3,691,842 A | 9/1972 | Akeley | 73/398 C |
| 3,701,280 A | 10/1972 | Stroman | 73/194 |
| 3,849,637 A | 11/1974 | Caruso et al. | 235/151 |
| 3,855,858 A | 12/1974 | Cushing | 73/194 EM |

(Continued)

FOREIGN PATENT DOCUMENTS

| | | |
|---|---|---|
| CA | 999950 | 11/1976 |
| DE | 32 13 866 A1 | 10/1983 |
| DE | 35 40 204 C1 | 9/1986 |
| DE | 40 08 560 A1 | 9/1990 |
| DE | 42 09 785 A1 | 9/1993 |
| DE | 43 43 747 | 6/1994 |
| DE | 44 33 593 A1 | 6/1995 |
| DE | 195 02 499 A1 | 8/1996 |
| DE | 296 00 609 U1 | 3/1997 |
| DE | 197 04 694 A1 | 8/1997 |

(Continued)

OTHER PUBLICATIONS

International Search Report and Written Opinion for International Application No. PCT/US2004/017300, filing date Jun. 3, 2004, date of mailing: Nov. 3, 2004.
Search Report "Notification of Transmittal of The International Search Report or the Declaration", PCT/US2004/025289.
Copy of U.S. Appl. No. 10/893,144/ filed Jul. 16, 2004.
U.S. Appl. No. 09/257,896, filed Feb. 25, 1999, Eryurek et al.

(Continued)

*Primary Examiner*—Peguy JeanPierre
*Assistant Examiner*—Joseph Lauture
(74) *Attorney, Agent, or Firm*—Westman, Champlin & Kelly

(57) ABSTRACT

A circuit includes a multiplexer, an analog-to-digital converter, and a processor that compares a sequence of digital outputs from the analog-to-digital converter to a sequence of normal ranges that correspond with the digital outputs in order to provide an error output when one of the digital outputs is outside its normal range.

25 Claims, 8 Drawing Sheets

U.S. PATENT DOCUMENTS

| | | | |
|---|---|---|---|
| 3,948,098 A | 4/1976 | Richardson et al. | 73/861.24 |
| 3,952,759 A | 4/1976 | Ottenstein | 137/12 |
| 3,973,184 A | 8/1976 | Raber | 324/51 |
| RE29,383 E | 9/1977 | Gallatin et al. | 137/14 |
| 4,058,975 A | 11/1977 | Gilbert et al. | 60/39.28 |
| 4,099,413 A | 7/1978 | Ohte et al. | 73/359 |
| 4,102,199 A | 7/1978 | Talpouras | 73/362 |
| 4,122,719 A | 10/1978 | Carlson et al. | 73/342 |
| 4,249,164 A | 2/1981 | Tivy | 340/870.3 |
| 4,250,490 A | 2/1981 | Dahlke | 340/870.37 |
| 4,279,013 A | 7/1981 | Cameron et al. | 340/870.37 |
| 4,337,516 A | 6/1982 | Murphy et al. | 364/551 |
| 4,399,824 A | 8/1983 | Davidson | 128/736 |
| 4,417,312 A | 11/1983 | Cronin et al. | 364/510 |
| 4,459,858 A | 7/1984 | Marsh | 73/861.12 |
| 4,463,612 A | 8/1984 | Thompson | 73/861.22 |
| 4,517,468 A | 5/1985 | Kemper et al. | 290/52 |
| 4,528,869 A | 7/1985 | Kubo et al. | 74/695 |
| 4,530,234 A | 7/1985 | Cullick et al. | 73/53 |
| 4,540,468 A | 9/1985 | Genco et al. | 162/49 |
| 4,571,689 A | 2/1986 | Hildebrand et al. | 364/481 |
| 4,630,265 A | 12/1986 | Sexton | 370/85 |
| 4,635,214 A | 1/1987 | Kasai et al. | 364/551 |
| 4,642,782 A | 2/1987 | Kemper et al. | 364/550 |
| 4,644,479 A | 2/1987 | Kemper et al. | 364/550 |
| 4,649,515 A | 3/1987 | Thompson et al. | 364/900 |
| 4,668,473 A | 5/1987 | Agarwal | 422/62 |
| 4,686,638 A | 8/1987 | Furuse | 364/558 |
| 4,707,796 A | 11/1987 | Calabro et al. | 364/552 |
| 4,720,806 A | 1/1988 | Schippers et al. | 364/551 |
| 4,736,367 A | 4/1988 | Wroblewski et al. | 370/85 |
| 4,736,763 A | 4/1988 | Britton et al. | 137/10 |
| 4,758,308 A | 7/1988 | Carr | 162/263 |
| 4,777,585 A | 10/1988 | Kokawa et al. | 364/164 |
| 4,804,958 A | 2/1989 | Longsdorf | 340/870.07 |
| 4,807,151 A | 2/1989 | Citron | 364/510 |
| 4,818,994 A | 4/1989 | Orth et al. | 340/501 |
| 4,831,564 A | 5/1989 | Suga | 364/551.01 |
| 4,841,286 A | 6/1989 | Kummer | 340/653 |
| 4,853,693 A | 8/1989 | Eaton-Williams | 340/588 |
| 4,873,655 A | 10/1989 | Kondraske | 364/553 |
| 4,907,167 A | 3/1990 | Skeirik | 364/500 |
| 4,924,418 A | 5/1990 | Backman et al. | 364/550 |
| 4,926,364 A | 5/1990 | Brotherton | 364/581 |
| 4,934,196 A | 6/1990 | Romano | 73/861.38 |
| 4,939,753 A | 7/1990 | Olson | 375/107 |
| 4,964,125 A | 10/1990 | Kim | 371/15.1 |
| 4,988,990 A | 1/1991 | Warrior | 340/25.5 |
| 4,992,965 A | 2/1991 | Holter et al. | 364/551.01 |
| 5,005,142 A | 4/1991 | Lipchak et al. | 364/550 |
| 5,019,760 A | 5/1991 | Chu et al. | 318/490 |
| 5,025,344 A | 6/1991 | Maly et al. | 361/88 |
| 5,043,862 A | 8/1991 | Takahashi et al. | 364/162 |
| 5,053,815 A | 10/1991 | Wendell | 355/208 |
| 5,057,774 A | 10/1991 | Verhelst et al. | 324/537 |
| 5,067,099 A | 11/1991 | McCown et al. | 364/550 |
| 5,081,598 A | 1/1992 | Bellows et al. | 364/551 |
| 5,089,979 A | 2/1992 | McEachern et al. | 364/571.04 |
| 5,089,984 A | 2/1992 | Struger et al. | 395/650 |
| 5,098,197 A | 3/1992 | Shepard et al. | 374/120 |
| 5,099,436 A | 3/1992 | McCown et al. | 364/550 |
| 5,103,409 A | 4/1992 | Shimizu et al. | 364/556 |
| 5,111,531 A | 5/1992 | Grayson et al. | 395/23 |
| 5,121,467 A | 6/1992 | Skeirik | 395/11 |
| 5,122,794 A | 6/1992 | Warrior | 340/825.2 |
| 5,122,976 A | 6/1992 | Bellows et al. | 364/550 |
| 5,130,936 A | 7/1992 | Sheppard et al. | 364/551.01 |
| 5,134,574 A | 7/1992 | Beaverstock et al. | 364/551.01 |
| 5,137,370 A | 8/1992 | McCullock et al. | 374/173 |
| 5,142,612 A | 8/1992 | Skeirik | 395/11 |
| 5,143,452 A | 9/1992 | Maxedon et al. | 374/170 |
| 5,148,378 A | 9/1992 | Shibayama et al. | 364/551.07 |
| 5,150,289 A | 9/1992 | Badavas | 364/154 |
| 5,167,009 A | 11/1992 | Skeirik | 395/27 |
| 5,175,678 A | 12/1992 | Frerichs et al. | 364/148 |
| 5,193,143 A | 3/1993 | Kaemmerer et al. | 395/51 |
| 5,197,114 A | 3/1993 | Skeirik | 395/22 |
| 5,197,328 A | 3/1993 | Fitzgerald | 73/168 |
| 5,212,765 A | 5/1993 | Skeirik | 395/11 |
| 5,214,582 A | 5/1993 | Gray | 364/424.03 |
| 5,216,226 A | 6/1993 | Miyoshi | 219/497 |
| 5,224,203 A | 6/1993 | Skeirik | 395/22 |
| 5,228,780 A | 7/1993 | Shepard et al. | 374/175 |
| 5,235,527 A | 8/1993 | Ogawa et al. | 364/571.05 |
| 5,265,031 A | 11/1993 | Malczewski | 364/497 |
| 5,265,222 A | 11/1993 | Nishiya et al. | 395/3 |
| 5,269,311 A | 12/1993 | Kirchner et al. | 128/672 |
| 5,274,572 A | 12/1993 | O'Neill et al. | 364/550 |
| 5,282,131 A | 1/1994 | Rudd et al. | 364/164 |
| 5,282,261 A | 1/1994 | Skeirik | 395/22 |
| 5,293,585 A | 3/1994 | Morita | 395/52 |
| 5,303,181 A | 4/1994 | Stockton | 365/96 |
| 5,305,230 A | 4/1994 | Matsumoto et al. | 364/495 |
| 5,311,421 A | 5/1994 | Nomura et al. | 364/157 |
| 5,317,520 A | 5/1994 | Castle | 364/482 |
| 5,327,357 A | 7/1994 | Feinstein et al. | 364/502 |
| 5,333,240 A | 7/1994 | Matsumoto et al. | 395/23 |
| 5,340,271 A | 8/1994 | Freeman et al. | 415/1 |
| 5,347,843 A | 9/1994 | Orr et al. | 73/3 |
| 5,349,541 A | 9/1994 | Alexandro, Jr. et al. | 364/578 |
| 5,357,449 A | 10/1994 | Oh | 364/551.01 |
| 5,361,628 A | 11/1994 | Marko et al. | 73/116 |
| 5,365,423 A | 11/1994 | Chand | 364/140 |
| 5,365,787 A | 11/1994 | Hernandez et al. | 73/660 |
| 5,367,612 A | 11/1994 | Bozich et al. | 395/22 |
| 5,384,699 A | 1/1995 | Levy et al. | 364/413.13 |
| 5,386,373 A | 1/1995 | Keeler et al. | 364/577 |
| 5,388,465 A | 2/1995 | Okaniwa et al. | 73/861.17 |
| 5,392,293 A | 2/1995 | Hsue | 324/765 |
| 5,394,341 A | 2/1995 | Kepner | 364/551.01 |
| 5,394,543 A | 2/1995 | Hill et al. | 395/575 |
| 5,404,064 A | 4/1995 | Mermelstein et al. | 310/319 |
| 5,408,406 A | 4/1995 | Mathur et al. | 364/163 |
| 5,408,586 A | 4/1995 | Skeirik | 395/23 |
| 5,410,495 A | 4/1995 | Ramamurthi | 364/511.05 |
| 5,414,645 A | 5/1995 | Hirano | 364/551.01 |
| 5,416,409 A * | 5/1995 | Hunter | 324/158.1 |
| 5,419,197 A | 5/1995 | Ogi et al. | 73/659 |
| 5,430,642 A | 7/1995 | Nakajima et al. | 364/148 |
| 5,434,774 A | 7/1995 | Seberger | 364/172 |
| 5,436,705 A | 7/1995 | Raj | 355/246 |
| 5,440,478 A | 8/1995 | Fisher et al. | 364/188 |
| 5,442,639 A | 8/1995 | Crowder et al. | 371/20.1 |
| 5,467,355 A | 11/1995 | Umeda et al. | 364/571.04 |
| 5,469,070 A | 11/1995 | Koluvek | 324/713 |
| 5,469,156 A | 11/1995 | Kogure | 340/870.38 |
| 5,469,735 A | 11/1995 | Watanabe | 73/118.1 |
| 5,469,749 A | 11/1995 | Shimada et al. | 73/861.47 |
| 5,481,199 A | 1/1996 | Anderson et al. | 324/705 |
| 5,481,200 A | 1/1996 | Voegele et al. | 324/718 |
| 5,483,387 A | 1/1996 | Bauhahn et al. | 359/885 |
| 5,485,753 A | 1/1996 | Burns et al. | 73/720 |
| 5,486,996 A | 1/1996 | Samad et al. | 364/152 |
| 5,488,697 A | 1/1996 | Kaemmerer et al. | 395/51 |
| 5,489,831 A | 2/1996 | Harris | 318/701 |
| 5,495,769 A | 3/1996 | Broden et al. | 73/718 |
| 5,510,779 A | 4/1996 | Maltby et al. | 340/870.3 |
| 5,511,004 A | 4/1996 | Dubost et al. | 364/551.01 |
| 5,526,293 A | 6/1996 | Mozumder et al. | 364/578 |
| 5,539,638 A | 7/1996 | Keeler et al. | 364/424.03 |
| 5,548,528 A | 8/1996 | Keeler et al. | 364/497 |

| | | | | | | |
|---|---|---|---|---|---|---|
| 5,555,190 A | 9/1996 | Derby et al. ............... 364/510 | 6,014,902 A | 1/2000 | Lewis et al. ............. 73/861.12 |
| 5,560,246 A | 10/1996 | Bottinger et al. ......... 73/861.15 | 6,016,523 A | 1/2000 | Zimmerman et al. ......... 710/63 |
| 5,561,599 A | 10/1996 | Lu ............................ 364/164 | 6,016,706 A | 1/2000 | Yamamoto et al. ................. 9/6 |
| 5,570,034 A | 10/1996 | Needham et al. ............ 324/763 | 6,017,143 A | 1/2000 | Eryurek et al. ............... 700/51 |
| 5,570,300 A | 10/1996 | Henry et al. ........... 364/551.01 | 6,023,399 A | 2/2000 | Kogure ....................... 361/23 |
| 5,572,420 A | 11/1996 | Lu ............................ 364/153 | 6,026,352 A | 2/2000 | Burns et al. ................ 702/182 |
| 5,573,032 A | 11/1996 | Lenz et al. .................. 137/486 | 6,038,579 A | 3/2000 | Sekine ........................ 708/400 |
| 5,591,922 A | 1/1997 | Segeral et al. ............ 73/861.04 | 6,045,260 A | 4/2000 | Schwartz et al. ............ 374/183 |
| 5,598,521 A | 1/1997 | Kilgore et al. ............. 395/326 | 6,046,642 A | 4/2000 | Brayton et al. ............. 330/296 |
| 5,600,148 A | 2/1997 | Cole et al. ............... 250/495.1 | 6,047,220 A | 4/2000 | Eryurek ........................ 700/28 |
| 5,608,650 A | 3/1997 | McClendon et al. ........ 364/510 | 6,047,222 A | 4/2000 | Burns et al. .................. 700/79 |
| 5,623,605 A | 4/1997 | Keshav et al. ........... 395/200.17 | 6,052,655 A | 4/2000 | Kobayashi et al. ......... 702/184 |
| 5,629,870 A | 5/1997 | Farag et al. ............ 364/551.01 | 6,061,603 A | 5/2000 | Papadopoulos et al. ....... 700/83 |
| 5,633,809 A | 5/1997 | Wissenbach et al. ....... 364/510 | 6,072,150 A | 6/2000 | Sheffer .................... 219/121.83 |
| 5,637,802 A | 6/1997 | Frick et al. .................... 73/724 | 6,094,600 A | 7/2000 | Sharpe, Jr. et al. ........... 700/19 |
| 5,640,491 A | 6/1997 | Bhat et al. .................... 395/22 | 6,112,131 A | 8/2000 | Ghorashi et al. ............. 700/142 |
| 5,654,869 A | 8/1997 | Ohi et al. ..................... 361/540 | 6,119,047 A | 9/2000 | Eryurek et al. ................ 700/28 |
| 5,661,668 A | 8/1997 | Yemini et al. ............... 364/550 | 6,119,529 A | 9/2000 | Di Marco et al. ....... 73/861.68 |
| 5,665,899 A | 9/1997 | Willcox ......................... 73/1.63 | 6,139,180 A | 10/2000 | Usher et al. ..................... 374/1 |
| 5,669,713 A | 9/1997 | Schwartz et al. ............... 374/1 | 6,151,560 A | 11/2000 | Jones ........................... 702/58 |
| 5,671,335 A | 9/1997 | Davis et al. .................. 395/23 | 6,176,247 B1 | 1/2001 | Winchcomb et al. ......... 137/14 |
| 5,672,247 A | 9/1997 | Pangalos et al. .............. 162/65 | 6,179,964 B1 | 1/2001 | Begemann et al. ......... 162/198 |
| 5,675,504 A | 10/1997 | Serodes et al. .............. 364/496 | 6,182,501 B1 | 2/2001 | Furuse et al. ................ 73/49.2 |
| 5,675,724 A | 10/1997 | Beal et al. ............... 395/182.02 | 6,192,281 B1 | 2/2001 | Brown et al. ................... 700/2 |
| 5,680,109 A | 10/1997 | Lowe et al. .................. 340/608 | 6,195,591 B1 | 2/2001 | Nixon et al. ..................... 700/2 |
| 5,682,317 A | 10/1997 | Keeler et al. ........... 364/431.03 | 6,199,018 B1 | 3/2001 | Quist et al. ..................... 702/34 |
| 5,700,090 A | 12/1997 | Eryurek ....................... 374/210 | 6,209,048 B1 | 3/2001 | Wolff ............................ 710/62 |
| 5,703,575 A | 12/1997 | Kirpatrick .............. 340/870.17 | 6,236,948 B1 | 5/2001 | Eck et al. ..................... 702/45 |
| 5,704,011 A | 12/1997 | Hansen et al. ................. 395/22 | 6,263,487 B1 | 7/2001 | Stripf et al. .................... 717/1 |
| 5,705,754 A | 1/1998 | Keita et al. ............... 73/861.357 | 6,272,438 B1 | 8/2001 | Cunningham et al. ........ 702/56 |
| 5,705,978 A | 1/1998 | Frick et al. .................. 340/511 | 6,289,735 B1 | 9/2001 | Dister et al. ................... 73/579 |
| 5,708,211 A | 1/1998 | Jepson et al. ............ 73/861.04 | 6,298,377 B1 | 10/2001 | Hartikainen et al. ........ 709/223 |
| 5,708,585 A | 1/1998 | Kushion ............... 364/431.061 | 6,307,483 B1 | 10/2001 | Westfield et al. ...... 340/870.11 |
| 5,710,370 A | 1/1998 | Shanahan et al. ............. 73/1.35 | 6,311,136 B1 | 10/2001 | Henry et al. ................... 702/45 |
| 5,710,708 A | 1/1998 | Wiegand ................. 364/470.1 | 6,317,701 B1 | 11/2001 | Pyostsia et al. ............. 702/188 |
| 5,713,668 A | 2/1998 | Lunghofer et al. ......... 374/179 | 6,327,914 B1 | 12/2001 | Dutton .................. 73/861.356 |
| 5,719,378 A | 2/1998 | Jackson, Jr. et al. ........ 219/497 | 6,347,252 B1 | 2/2002 | Behr et al. ..................... 700/2 |
| 5,736,649 A | 4/1998 | Kawasaki et al. ........ 73/861.23 | 6,356,191 B1 | 3/2002 | Kirkpatrick et al. ........ 340/501 |
| 5,741,074 A | 4/1998 | Wang et al. ................. 374/185 | 6,360,277 B1 | 3/2002 | Ruckley et al. .................. 9/250 |
| 5,742,845 A | 4/1998 | Wagner ....................... 395/831 | 6,370,448 B1 | 4/2002 | Eryurek et al. ............. 700/282 |
| 5,746,511 A | 5/1998 | Eryurek et al. ................. 374/2 | 6,377,859 B1 | 4/2002 | Brown et al. ................. 700/79 |
| 5,747,701 A | 5/1998 | Marsh et al. ............. 73/861.23 | 6,396,426 B1 | 5/2002 | Balard et al. ................. 341/120 |
| 5,752,008 A | 5/1998 | Bowling ..................... 395/500 | 6,397,114 B1 | 5/2002 | Eryurek et al. ................ 700/51 |
| 5,764,539 A | 6/1998 | Rani ........................... 364/557 | 6,405,099 B1 | 6/2002 | Nagai et al. .................. 700/159 |
| 5,764,891 A | 6/1998 | Warrior ..................... 395/200.2 | 6,425,038 B1 | 7/2002 | Sprecher ..................... 710/269 |
| 5,781,024 A | 7/1998 | Blomberg et al. ........... 324/763 | 6,434,504 B1 | 8/2002 | Eryurek et al. ............. 702/130 |
| 5,781,878 A | 7/1998 | Mizoguchi et al. ......... 701/109 | 6,449,574 B1 | 9/2002 | Eryurek et al. ............... 702/99 |
| 5,790,413 A | 8/1998 | Bartusiak et al. ........... 364/485 | 6,473,656 B1 | 10/2002 | Langels et al. ............... 700/17 |
| 5,801,689 A | 9/1998 | Huntsman .................. 345/329 | 6,473,710 B1 | 10/2002 | Eryurek ....................... 702/133 |
| 5,805,442 A | 9/1998 | Crater et al. ................. 364/138 | 6,480,793 B1 | 11/2002 | Martin ......................... 702/45 |
| 5,817,950 A | 10/1998 | Wiklund et al. ........... 73/861.66 | 6,492,921 B1 | 12/2002 | Kunitani et al. ............. 341/118 |
| 5,825,664 A | 10/1998 | Warrior et al. ............... 700/7 | 6,493,689 B1 | 12/2002 | Kotoulas et al. ............. 706/23 |
| 5,828,567 A | 10/1998 | Eryurek et al. ............... 700/79 | 6,505,517 B1 | 1/2003 | Eryurek et al. ........... 73/861.08 |
| 5,829,876 A | 11/1998 | Schwartz et al. ................ 374/1 | 6,519,546 B1 | 2/2003 | Eryurek et al. ............. 702/130 |
| 5,848,383 A | 12/1998 | Yuuns ......................... 702/102 | 6,532,392 B1 | 3/2003 | Eryurek et al. ............... 700/54 |
| 5,854,993 A | 12/1998 | Grichnik ...................... 702/54 | 6,539,267 B1 | 3/2003 | Eryurek et al. ............... 700/51 |
| 5,859,964 A | 1/1999 | Wang et al. ............ 395/185.01 | 6,546,814 B1 | 4/2003 | Choe et al. ................ 73/862.08 |
| 5,869,772 A | 2/1999 | Storer ....................... 73/861.24 | 6,556,145 B1 | 4/2003 | Kirkpatrick et al. ... 340/870.17 |
| 5,876,122 A | 3/1999 | Eryurek ........................ 374/183 | 6,594,603 B1 | 7/2003 | Eryurek et al. ............. 702/104 |
| 5,880,376 A | 3/1999 | Sai et al. .................. 73/861.08 | 6,601,005 B1 | 7/2003 | Kavaklioglu et al. ........ 702/104 |
| 5,887,978 A | 3/1999 | Lunghofer et al. ......... 374/179 | 6,611,775 B1 | 8/2003 | Coursolle et al. ............. 702/65 |
| 5,908,990 A | 6/1999 | Cummings ............... 73/861.22 | 6,615,149 B1 | 9/2003 | Wehrs ........................... 702/76 |
| 5,923,557 A | 7/1999 | Eidson ..................... 364/471.03 | 6,654,697 B1 | 11/2003 | Eryurek et al. ................ 702/47 |
| 5,924,086 A | 7/1999 | Mathur et al. ............... 706/25 | 6,701,274 B1 | 3/2004 | Eryurek et al. ............. 702/140 |
| 5,926,778 A | 7/1999 | Pöppel ....................... 702/130 | 2002/0013629 A1 | 1/2002 | Nixon et al. |
| 5,936,514 A | 8/1999 | Anderson et al. ...... 340/310.01 | 2002/0032544 A1 | 3/2002 | Reid et al. .................... 702/183 |
| 5,940,290 A | 8/1999 | Dixon ......................... 364/138 | 2002/0077711 A1 | 6/2002 | Nixon et al. ................... 700/51 |
| 5,956,663 A | 9/1999 | Eryurek ....................... 702/183 | 2002/0121910 A1 | 9/2002 | Rome et al. ................. 324/718 |
| 5,970,430 A | 10/1999 | Burns et al. ................. 702/122 | 2002/0145568 A1 | 10/2002 | Winter ......................... 343/701 |
| 6,002,952 A | 12/1999 | Diab et al. ................... 600/310 | 2002/0148644 A1 | 10/2002 | Schultz et al. ................ 175/39 |
| 6,014,612 A | 1/2000 | Larson et al. ............... 702/183 | 2003/0033040 A1 | 2/2003 | Billings ........................ 700/97 |

| | | | |
|---|---|---|---|
| 2003/0045962 A1 | 3/2003 | Eryurek et al. ............. 700/127 | |

FOREIGN PATENT DOCUMENTS

| | | |
|---|---|---|
| DE | 19930660 A1 | 7/1999 |
| DE | 199 05 071 | 8/2000 |
| DE | 299 17 651 U1 | 12/2000 |
| DE | 100 36 971 A1 | 2/2002 |
| DE | 102 23 725 A1 | 4/2003 |
| EP | 0 122 622 A1 | 10/1984 |
| EP | 0 413 814 A1 | 2/1991 |
| EP | 0 487 419 A2 | 5/1992 |
| EP | 0 512 794 A2 | 11/1992 |
| EP | 0 594 227 A1 | 4/1994 |
| EP | 0 624 847 A1 | 11/1994 |
| EP | 0 644 470 A2 | 3/1995 |
| EP | 0 825 506 A2 | 7/1997 |
| EP | 0 807 804 A2 | 9/1997 |
| EP | 0 827 096 A2 | 9/1997 |
| EP | 0 838 768 A2 | 9/1997 |
| EP | 1 058 093 A1 | 5/1999 |
| EP | 1 022 626 A2 | 7/2000 |
| FR | 2 302 514 | 9/1976 |
| FR | 2 334 827 | 7/1977 |
| GB | 928704 | 6/1963 |
| GB | 1 534 280 | 11/1978 |
| GB | 1 534 288 | 11/1978 |
| GB | 2 310 346 A | 8/1997 |
| GB | 2 317 969 | 9/1997 |
| GB | 2 342 453 A | 4/2000 |
| GB | 2 347 232 A | 8/2000 |
| JP | 57 196619 | 2/1982 |
| JP | 58-129316 | 8/1983 |
| JP | 59-116811 | 7/1984 |
| JP | 59-163520 | 9/1984 |
| JP | 59-211196 | 11/1984 |
| JP | 59-211896 | 11/1984 |
| JP | 60-000507 | 1/1985 |
| JP | 60-76619 | 5/1985 |
| JP | 60-131495 | 7/1985 |
| JP | 60-174915 | 9/1985 |
| JP | 62-30915 | 2/1987 |
| JP | 64-01914 | 1/1989 |
| JP | 64-72699 | 3/1989 |
| JP | 2-05105 | 1/1990 |
| JP | 3-229124 | 10/1991 |
| JP | 5-122768 | 5/1993 |
| JP | 06242192 | 9/1994 |
| JP | 06-248224 | 10/1994 |
| JP | 7-063586 | 3/1995 |
| JP | 07234988 | 9/1995 |
| JP | 8-054923 | 2/1996 |
| JP | 8-102241 | 4/1996 |
| JP | 08-114638 | 5/1996 |
| JP | 8-136386 | 5/1996 |
| JP | 8-166309 | 6/1996 |
| JP | 8-247076 | 9/1996 |
| JP | 8-313466 | 11/1996 |
| JP | 2712625 | 10/1997 |
| JP | 2712701 | 10/1997 |
| JP | 2753592 | 3/1998 |
| JP | 07225530 | 5/1998 |
| JP | 10-232170 | 9/1998 |
| JP | 11-0083575 | 3/1999 |
| WO | WO 94/25933 | 11/1994 |
| WO | WO 96/11389 | 4/1996 |
| WO | WO 96/12993 | 5/1996 |
| WO | WO 96/39617 | 12/1996 |
| WO | WO 97/21157 | 6/1997 |
| WO | WO 97/25603 | 7/1997 |
| WO | WO 98/06024 | 2/1998 |
| WO | WO 98/13677 | 4/1998 |
| WO | WO 98/14855 | 4/1998 |
| WO | WO 98/20469 | 5/1998 |
| WO | WO 98/39718 | 9/1998 |
| WO | WO 99/19782 | 4/1999 |
| WO | WO 00/41050 | 7/2000 |
| WO | WO 00/55700 | 9/2000 |
| WO | WO 00/70531 | 11/2000 |
| WO | WO 01/01213 A1 | 1/2001 |
| WO | WO 01/77766 | 10/2001 |
| WO | WO 02/27418 | 4/2002 |
| WO | WO 03/040657 A2 | 5/2003 |
| WO | WO 03/040851 A2 | 5/2003 |
| WO | WO 03/060851 A1 | 7/2003 |

OTHER PUBLICATIONS

U.S. Appl. No. 09/409,098, filed Sep. 30, 1999, Eryurek et al.

U.S. Appl. No. 09/799,824, filed Mar. 5, 2001, Rome et al.

U.S. Appl. No. 09/855,179, filed May 14, 2001, Eryurek et al.

U.S. Appl. No. 09/852,102, filed May 9, 2001, Eryurek et al.

U.S. Appl. No. 09/972,078, filed Oct. 5, 2001, Eryurek et al.

U.S. Appl. No. 10/635,944, filed Aug. 7, 2003, Huisenga et al.

"A TCP/IP Tutorial" by, Socolofsky et al., Spider Systems Limited, Jan. 1991 pp. 1–23.

"Approval Standards For Explosionproof Electrical Equipment General Requirements", Factory Mutual Research, Cl. No. 3615, Mar. 1989, pp. 1–34.

"Approval Standard Intrinsically Safe Apparatus and Associated Apparatus For Use In Class I, II, and III, Division 1 Hazardous (Classified) Locations", Factory Mutual Research, Cl. No. 3610, Oct. 1988, pp. 1–70.

"Automation On–line" by, Phillips et al., Plant Services, Jul. 1997, pp. 41–45.

"Climb to New Heights by Controlling your PLCs Over the Internet" by, Phillips et al., Intech, Aug. 1998, pp. 50–51.

"CompProcessor For Piezoresistive Sensors" MCA Technologies Inc. (MCA7707), pp. 1–8, date unknown.

"Ethernet emerges as viable, inexpensive fieldbus", Paul. G. Schreier, Personal Engineering, Dec. 1997, p. 23–29.

"Ethernet Rules Closed–loop System" by, Eidson et al., Intech, Jun. 1998, pp. 39–42.

"Fieldbus Standard for Use in Industrial Control Systems Part 2: Physical Layer Specification and Service Definition", ISA–S50.02–1992, pp. 1–93.

"Fieldbus Standard for Use in Industrial Control Systems Part 3: Data Link Service Definition", ISA–S50.02–1997, Part 3, Aug. 1997, pp. 1–159.

Fieldbus Standard For Use in Industrial Control Systems Part 4: Data Link Protocol Specification, ISA–S50.02–1997, Part 4, Aug. 1997, pp. 1–148.

"Fieldbus Support For Process Analysis" by, Blevins et al., Fisher–Rosemount Systems, Inc., 1995, pp. 121–128.

"Fieldbus Technical Overview Understanding FOUNDA-TION™ fieldbus technology", Fisher–Rosemount, 1998, pp. 1–23.

"Hypertext Transfer Protocol—HTTP/1.0" by, Berners–lee et al., MIT/LCS, May 1996, pp. 1–54.

"Infranets, Intranets, and the Internet" by, Pradip Madan, Echelon Corp, Sensors, Mar. 1997, pp. 46–50.

"Internet Technology Adoption into Automation" by, Fondl et al., Automation Business, pp. 1–5.

"Internet Protocol Darpa Internet Program Protocol Specification" by, Information Sciences Institute, University of Southern California, RFC 791, Sep. 1981, pp. 1–43.

"Introduction to Emit", emWare, Inc., 1997, pp. 1–22.

"Introduction to the Internet Protocols" by, Charles L. Hedrick, Computer Science Facilities Group, Rutgers University, Oct. 3, 1988, pp. 1–97.

"Is There A Future For Ethernet in Industrial Control?", Miclot et al., Plant Engineering, Oct. 1988, pp. 44–46, 48, 50.

LFM/SIMA Internet Remote Diagnostics Research Project Summary Report, Stanford University, Jan. 23, 1997, pp. 1–6.

"Managing Devices with the Web" by, Howard et al., Byte, Sep. 1997, pp. 45–64.

"Modular Microkernel Links GUI And Browser For Embedded Web Devices" by, Tom Williams, pp. 1–2.

"PC Software Gets Its Edge From Windows, Components, and the Internet", Wayne Labs, I&CS, Mar. 1997, pp. 23–32.

Proceedings Sensor Expo, Aneheim, California, Produced by Expocon Managemnet Associates, Inc., Apr. 1996, pp. 9–21.

Proceedings Sensor Expo, Boston, Massachuttes, Produced by Expocon Management Associates, Inc., May 1997, pp. 1–416.

"Smart Sensor Network of the Future" by, Jay Warrior, Sensors, Mar. 1997, pp. 40–45.

"The Embedded Web Site" by, John R. Hines, IEEE Spectrum, Sep. 1996, p. 23.

"Transmission Control Protocol: Darpa Internet Program Protocol Specification" Information Sciences Institute, Sep. 1981, pp. 1–69.

"On–Line Statistical Process Control for a Glass Tank Ingredient Scale," by R.A. Weisman, *IFAC real Time Programming*, 1985, pp. 29–38.

"The Performance of Control Charts for Monitoring Process Variation," by C. Lowry et al., *Commun. Statis.—Simula.*, 1995, pp. 409–437.

"A Knowledge–Based Approach for Detection and Diagnosis of Out–Of–Control Events in Manufacturing Processes," by P. Love et al., *IEEE*, 1989, pp. 736–741.

"Advanced Engine Diagnostics Using Universal Process Modeling", by P. O'Sullivan, *Presented at the 1996 SAE Conference on Future Transportation Technology*, pp. 1–9.

Parallel, Fault–Tolerant Control and Diagnostics System for Feedwater Regulation in PWRS, by E. Eryurek et al., *Proceedings of the American Power Conference*, date unknown.

"Programmable Hardware Architectures for Sensor Validation", by M.P. Henry et al., *Control Eng. Practice*, vol. 4, No. 10., pp. 1339–1354, (1996).

"Sensor Validation for Power Plants Using Adaptive Backpropagation Neural Network," *IEEE Transactions on Nuclear Science*, vol. 37, No. 2, by E. Eryurek et al. Apr. 1990, pp. 1040–1047.

"Signal Processing, Data Handling and Communications: The Case for Measurement Validation", by M.P. Henry, *Department of Engineering Science, Oxford University*, date unknown.

"Smart Temperature Measurement in the '90s", by T. Kerlin et al., *C&I*, (1990).

"Software–Based Fault–Tolerant Control Design for Improved Power Plant Operation," *IEEE/IFAC Joint Symposium on Computer–Aided Control System Design*, Mar. 7–9, 1994 pp. 585–590.

A Standard Interface for Self–Validating Sensors, by M.P. Henry et al., *Report No. QUEL 1884/91*, (1991).

"Taking Full Advantage of Smart Transmitter Technology Now," by G. Orrison, *Control Engineering*, vol. 42, No. 1, Jan. 1995.

"Using Artificial Neural Networks to Identify Nuclear Power Plant States," by Israel E. Alguindigue et al., pp. 1–4, date unknown.

"Application of Neural Computing Paradigms for Signal Validation," by B.R. Upadhyaya et al., *Department of Nuclear Engineering*, pp. 1–18, date unknown.

"Application of Neural Networks for Sensor Validation and Plant Monitoring," by, B. Upadhyaya et al., *Nuclear Technology*, vol. 97, No. 2, Feb. 1992 pp. 170–176.

"Automated Generation of Nonlinear System Characterization for Sensor Failure Detection," by B.R. Upadhyaya et al., *ISA*, 1989 pp. 269–274.

"In Situ Calibration of Nuclear Plant Platinum Resistance Thermometers Using Johnson Noise Methods," *EPRI*, Jun. 1983.

"Johnson Noise Thermometer for High Radiation and High–Temperature Environment," by L. Oakes et al., *Fifth Symposium on Space Nuclear Power Systems*, Jan., pp. 2–23.

"Development of a Resistance Thermometer For Use Up to 1600°C.", M.J. et al., *Cal Lab*, Jul./Aug. 1996, pp. 38–41.

"Survey, Applications, And Prospects of Johnson Noise Thermometry," by T. Blalock et al., *Electrical Engineering Department*, 1981 pp. 2–11.

"Noise Thermometry for Industrial and Metrological Applications at KFA Julich," by H. Brixy et al., *7th International Symposium on Temperature*, 1992.

"Johnson Noise Power Thermometer and its Application in Process Temperature Measurement," by T.V. Blalock et al., *American Institute of Physics* 1982, pp. 1249–1259.

"Field–based Architecture is Based on Open Systems, Improves Plant Performance", by P. Cleaveland, *I&CS*, Aug. 1996, pp. 73–74.

"Tuned–Circuit Dual–Mode Johnson Noise Thermometers," by R.L. Shepard et al., Apr. 1992.

"Tuned–Circuit Johnson Noise Thermometry," by Michael Roberts et al., $7^{th}$ *Symposium on Space Nuclear Power Systems*, Jan. 1990.

"Smart Field Devices Provide New Process Data, Increase System Flexibility," by Mark Boland, *I&CS*, Nov. 1994, pp. 45–51.

"Wavelet Analysis of Vibration, Part I: Theory[1]," by D.E. Newland, *Journal of Vibration and Acoustics*, vol. 116, Oct. 1994, pp. 409–416.

"Wavelet Analysis of Vibration, Part 2: Wavelet Maps," by D.E. Newland, *Journal of Vibration and Acoustics*, vol. 116, Oct. 1994, pp. 417–425.

"Development of a Long–Life, High–Reliability Remotely Operated Johnson Noise Thermometer," by R.L. Shepard et al., *ISA*, 1991, pp. 77–84.

"Application of Johnson Noise Thermometry to Space Nuclear Reactors," by M.J. Roberts et al., *Presented at the 6th Symposium on Space Nuclear Power Systems*, Jan. 9–12, 1989.

"A Decade of Progress in High Temperature Johnson Noise Thermometry," by T.V. Blalock et al., *American Institute of Physics*, 1982 pp. 1219–1223.

"Sensor and Device Diagnostics for Predictive and Proactive Maintenance", by B. Boynton, *A Paper Presented at the Electric Power Research Institute—Fossil Plant Maintenance Conference* in Baltimore, Maryland, Jul. 29–Aug. 1, 1996, pp. 50–1–50–6.

"Detection of Hot Spots in Thin Metal Films Using an Ultra Sensitive Dual Channel Noise Measurement System," by G.H. Massiha et al., *Energy and Information Technologies in the Southeast*, vol. 3 of 3, Apr. 1989, pp. 1310–1314.

"Detecting Blockage in Process Connections of Differential Pressure Transmitters", by E. Taya et al., *SICE*, 1995, pp. 1605–1608.

"Development and Application of Neural Network Algorithms For Process Diagnostics," by B.R. Upadhyaya et al., *Proceedings of the 29th Conference on Decision and Control*, 1990, pp. 3277–3282.

"A Fault–Tolerant Interface for Self–Validating Sensors", by M.P. Henry, *Colloquium*, pp. 3/1–3/2 (Nov. 1990).

"Fuzzy Logic and Artificial Neural Networks for Nuclear Power Plant Applications," by R.C. Berkan et al., *Proceedings of the American Power Conference*, date unknown.

"Fuzzy Logic and Neural Network Applications to Fault Diagnosis", by P. Frank et al., *International Journal of Approximate Reasoning*, (1997), pp. 68–88.

"Keynote Paper: Hardware Compilation–A New Technique for Rapid Prototyping of Digital Systems–Applied to Sensor Validation", by M.P. Henry, *Control Eng. Practice*, vol. 3, No. 7., pp. 907–924, (1995).

"The Implications of Digital Communications on Sensor Validation", by M. Henry et al., *Report No. QUEL 1912/92*, (1992).

"In–Situ Response Time Testing of Thermocouples", *ISA*, by H.M. Hashemian et al., Paper No. 89–0056, pp. 587–593, (1989).

"An Integrated Architecture For Signal Validation in Power Plants," by B.R. Upadhyaya et al., *Third IEEE International Symposium on Intelligent Control*, Aug. 24–26, 1988, pp. 1–6.

"Integration of Multiple Signal Validation Modules for Sensor Monitoring," by B. Upadhyaya et al., *Department of Nuclear Engineering*, Jul. 8, 1990, pp. 1–6.

"Intelligent Behaviour for Self–Validating Sensors", by M.P. Henry, *Advances In Measurement*, pp. 1–7, (May 1990).

"Measurement of the Temperature Fluctuation in a Resistor Generating 1/F Fluctuation," by S. Hashiguchi, *Japanese Journal of Applied Physics*, vol. 22, No. 5, Part 2, May 1983, pp. L284–L286.

"Check of Semiconductor Thermal Resistance Elements by the Method of Noise Thermometry", by A. B. Kisilevskii et al., *Measurement Techniques*, vol. 25, No. 3, Mar. 1982, New York, USA, pp. 244–246.

"Neural Networks for Sensor Validation and Plant Monitoring," by B. Upadhyaya, *International Fast Reactor Safety Meeting*, Aug. 12–16, 1990, pp. 2–10.

"Neural Networks for Sensor Validation and Plantwide Monitoring," by E. Eryurek, 1992.

"A New Method of Johnson Noise Thermometry", by C.J. Borkowski et al., *Rev. Sci. Instrum.*, vol. 45, No. 2, (Feb. 1974) pp. 15–162.1

"Thermocouple Continuity Checker," IBM Technical Disclosure Bulletin, vol. 20, No. 5, pp. 1954 (Oct. 1977).

"A Self–Validating Thermocouple," Janice C–Y et al., IEEE Transactions on Control Systems Technology, vol. 5, No. 2, pp. 239–253 (Mar. 1997).

*Instrument Engineers' Handbook*, Chapter IV entitles "Temperature Measurements," by T.J. Claggett, pp. 266–333 (1982).

"emWare's Releases EMIT 3.0, Allowing Manufacturers to Internet and Network Enable Devices Royalty Free," 3 pages, PR Newswire (Nov. 4, 1998).

Warrior, J., "The IEEE P1451.1 Object Model Network Independent Interfaces for Sensors and Actuators," pp. 1–14, Rosemount Inc. (1997).

Warrior, J., "The Collision Between the Web and Plant Floor Automation," $6^{th}$. WWW Conference Workshop on Embedded Web Technology, Santa Clara, CA (Apr. 7, 1997).

Microsoft Press Computer Dictionary, $3^{rd}$ Edition, p. 124, date unknown.

"Internal Statistical Quality Control for Quality Monitoring Instruments", by P. Girling et al., *ISA*, 15 pgs., 1999.

Web Pages from www.triant.com (3 pgs.), date unknown.

"Statistical Process Control (Practice Guide Series Book)", *Instrument Society of America*, 1995, pp. 1–58 and 169–204.

"Time–Frequency Analysis of Transient Pressure Signals for a Mechanical Heart Valve Cavitation Study," *ASAIO Journal*, by Alex A. Yu et al., vol. 44, No. 5, pp. M475–M479, (Sep.–Oct. 1998).

"Transient Pressure Signals in Mechanical Heart Valve Caviation," by Z.J. Wu et al., pp. M555–M561 (undated).

"Caviation in Pumps, Pipes and Valves," *Process Engineering*, by Dr. Ronald Young, pp. 47 and 49 (Jan. 1990).

"Quantification of Heart Valve Cavitation Based on High Fidelity Pressure Measurements," *Advances in Bioengineering 1994*, by Laura A. Garrison et al., BED–vol. 28, pp. 297–298 (Nov. 6–11, 1994).

"Monitoring and Diagnosis of Cavitation in Pumps and Valves Using the Wigner Distribution," *Hydroaccoustic Facilities, Instrumentation, and Experimental Techniques*, NCA–vol. 10, pp. 31–36 (1991).

"Developing Predictive Models for Cavitation Erosion," *Codes and Standards in A Global Environment*, PVP–vol. 259, pp. 189–192 (1993).

"Self–Diagnosing Intelligent Motors: A Key Enabler for Next Generation Manufacturing System," by Fred M. Discenzo et al., pp. 3/1–3/4 (1999).

"A Microcomputer–Based Instrument for Applications in Platinum Resistance Thermomety," by H. Rosemary Taylor and Hector A. Navarro, Journal of Physics E. Scientific Instrument, vol. 16, No. 11, pp. 1100–1104 (1983).

"Experience in Using Estelle for the Specification and Verification of a Fieldbus Protocol: FIP," by Barretto et al., Computer Networking, pp. 295–304 (1990).

"Computer Simulation of H1 Field Bus Transmission," by Utsumi et al., Advances in Instrumentation and Control, vol. 46, Part 2, pp. 1815–1827 (1991).

"Progress in Fieldbus Developments for Measuring and Control Application," by A. Schwaier, Sensor and Actuators, pp. 115–119 (1991).

"Ein Emulationssystem zur Leistungsanalyse von Feldbussystemen, Teil 1," by R. Hoyer, pp. 335–336 (1991).

"Simulators Integrato: Controllo su bus di campo," by Barabino et al., Automazione e Strumentazione, pp. 85–91 (Oct. 1993).

"Ein Modulares, verteiltes Diagnose–Expertensystem für die Fehlerdiagnose in lokalen Netzen," by Jürgen M. Schröder, pp. 557–565 (1990).

"Fault Diagnosis of Fieldbus Systems," by Jürgen Quade, pp. 577–581 (10/92).

"Ziele und Anwendungen von Feldbussystemen," by T. Pfeifer et al., pp. 549–557 (Oct. 1987).

"PROFIBUS Infrastructure Measures," by Tilo pfeifer et al., pp. 416–419 (Aug. 1991).

"Simulation the Time Behaviour of Fieldbus Systems," by O. Schnelle, pp. 440–442 (1991).

"Modélisation et simulation d'un bus de terrain: FIP, " by Song et al, pp. 5–9 (undated).

"Field Bus Networks for Automation for Automation Systems Containing Intelligent Functional Unites," by W. Kriesel et al., pp. 486–489 (1987).

"Field Buses for Process Interconnection with Digital Control Systems," Tecnología, pp. 141–147 (1990).

"Decentralised Systems with Real–Time Field Bus," Netzwerke, Jg. Nr.3 v. 14.3, 4 pages (1990).

"Process Measurement and Analysis," by Liptak et al., Instrument Engineers' Handbook, Third Edition, pp. 528–530, (1995).

"Improving Dynamic Performance of Temperature Sensors With Fuzzy Control Techniques," by Wang Lei et al., pp. 872–873 (1992).

"Microsoft Press Computer Dictionary" 2nd Edition, 1994, Microsoft Press. p. 156.

Copy of International Search Report from Application No. PCT/US01/40791 with international filing date of May 22, 2001.

Copy of International Search Report from Application No. PCT/US01/40782 with international filing date of May 22, 2001.

Copy of International Search Report from Application No. PCT/02/14560 with international filing date of May 8, 2002.

Copy of International Search Report from Application No. PCT/US02/14934 with international filing date of May 8, 2002..

"On–Line Tool Condition monitoring System With Wavelet Fuzzy Neural Network," by Li Xiaoli et al., pp. 271–276 (1997).

"Optimal Design of the Coils of An Electromagnetic Flow Meter," by Michalski, A. et al., IEEE Transactions on Magnetics, vol. 34, Issue 5, Part 1, pp. 2563–2566 (1998).

"Magnetic Fluid Flow Meter for Gases," Popa, N.C., IEEE Transactions on Magnetics, vol. 30, Issue 2, Part 1–2, pp. 936–938 (1993).

"New Approach to A Main Error Estimation for Primary Transducer of Electromagnetic Flow Meter," by Michalski, A., IEEE Instrumentation and Measurement Technology Conference Proceedings, vol. 2, pp. 1093–1097 (1998).

"Additional Information From Flowmeters Via Signal Analysis," by Amadi–Echendu, J.E. et al., IEEE Instrumentation and Measurement Technology Conference Record, vol. 7, pp. 187–193 (1990).

Copy of International Search Report from Application No. PCT/US02/06606 with international filing date of Mar. 5, 2002.

Copy of International Search Report from Application No. PCT/US02/30465 with international filing date of Sep. 25, 2002.

"What is a weighted moving average?", *Dau Stat Refresher*, http://cne.gmu.edu/modules/dau/stat/mvavgs/wma_bdy.html. (1995).

U.S. Appl. No. 10/675,014, filed Sep. 2003, Longsdorf et al.

U.S. Appl. No. 10/744,809, filed Dec. 2003, Brown et al.

"Statistics Glossary: Time Series Data", by Easton et al., http://www.stats.gla.ac.uk/steps/glossary/time_series.html, Sep. 1997.

"Indicators Story", Sustainable Seattle, pp. 55–59, 1998.

"Detecting Regimes in Temperature Time Series", by Clemins et al., *Artificial Neural Networks in Engineering, Proceedings*, pp. 727–732, 2001.

"Re: Digital Filter–Moving Average", The Math Forumn, http://mathforum.org/discuss/sci.math/a/t/177212, Sep. 28, 1998.

U.S. Appl. No. 10/733,558, filed Dec. 11, 2003.

U.S. Appl. No. 10/635,944, filed Aug. 7, 2003.

U.S. Appl. No. 10/719,163, filed Nov. 21, 2003.

FIELDVUE® Instruments, "Improving Safety Instrumented System Reliability," Emerson Process Management, cover sheet, Technology and Innovation in Process Control, 8 pages, 2002.

"Functional Safety and Safety Integrity Levels", *Applications Note*, Apr. 2002, pp. 1–6.

Article entitled "Safety Field $^{TT}$2600T Pressure Transmitter Family", *ABB Instrumentation Spa*, 29 pages, date unknown.

Notification of Transmittal of the International Search Report and the Written Opinion of the International Search Authority, or the Declaration for International Application No. PCT/US2004/025291, filed Aug. 5, 2004; date of mailing: Dec. 1, 2005.

Invitation to Pay Addition Fees for International Application No. PCT/US2004/031678 filed Sep. 27, 2004, date of mailing Jan. 19, 2005.

Notification of Transmittal of the International Search Report and the Written Opinion of the International Search Authority, or the Declaration for International Application No. PCT/US2005/011385, filed Apr. 1, 2005; date of mailing: Jul. 4, 2005.

\* cited by examiner

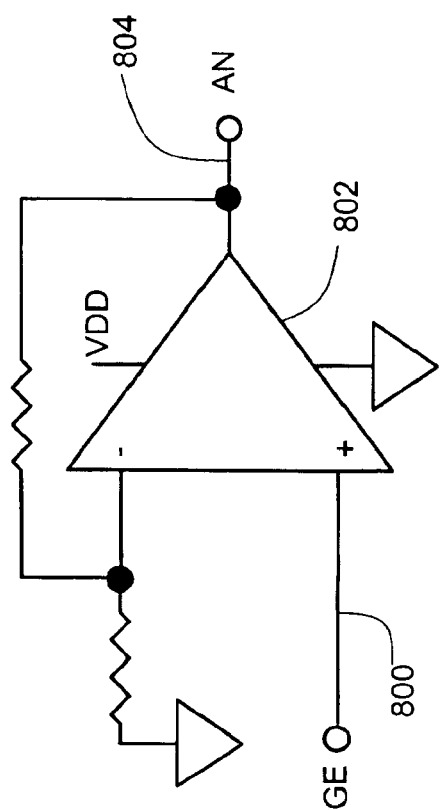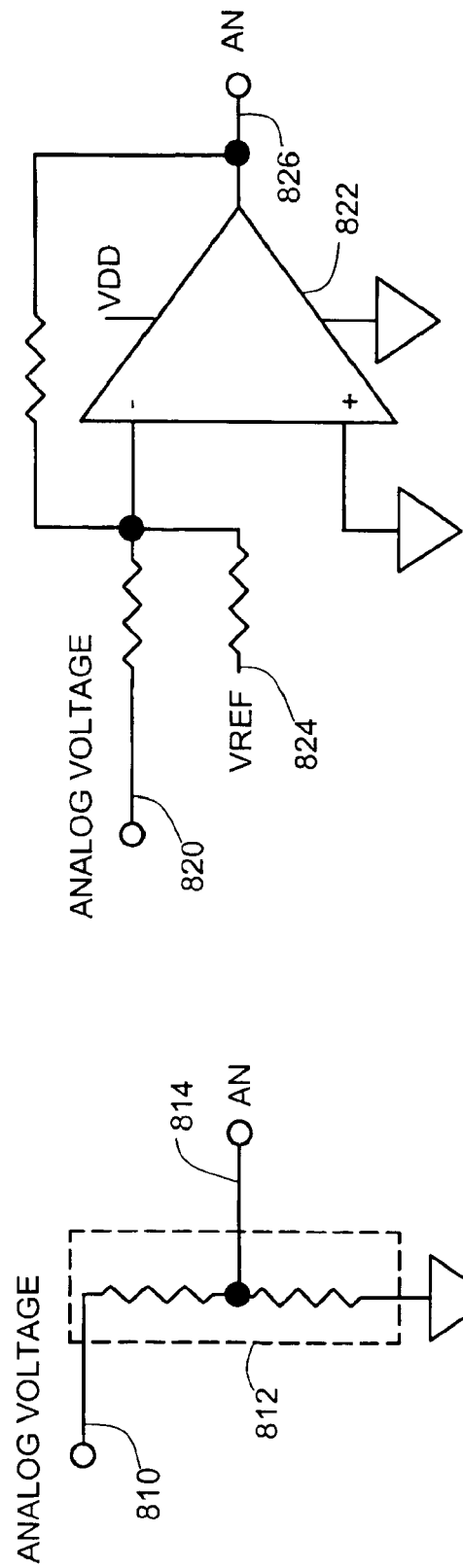
FIG. 8A
FIG. 8B
FIG. 8C

ANALOG-TO-DIGITAL CONVERTER WITH RANGE ERROR DETECTION

BACKGROUND OF THE INVENTION

Multiplexed analog-to-digital (A/D) converters have input pins for receiving multiple analog inputs, and provide digital outputs that represent the analog inputs. The digital outputs are fed into a microcontroller which uses the digital outputs to generate a microcontroller output that is a function of the analog inputs. Typically, the A/D converter and microcontroller are part of an industrial process control transmitter and the microcontroller output represents a process variable that is compensated for temperature, power supply voltages, etc., all of which are analog inputs.

Various types of malfunctions can occur in the circuitry. One malfunction that can occur is a short between adjacent input pins of the multiplexer. Another malfunction that can occur is a microcontroller or multiplexer failure that results in one of the digital selections bits for the multiplexer becoming stuck at either a high level (1) or a low level (0). Still another malfunction that can occur is an A/D converter failure that results in one of the digital output bits becoming stuck at either a high level (1) or a low level (0).

When A/D converter systems are used in Safety Instrumented Systems (SIS), there is a need to identify when such malfunctions occur and provide an error or diagnostic output. A high degree of confidence is needed in the reliability of the A/D converter. A diagnostic output from the microcontroller is needed so that a process control system supported by the A/D converter system is alerted to malfunctions.

SUMMARY OF THE INVENTION

A circuit comprises a multiplexer. The multiplexer has a select input and a sequence of analog outputs that are selected from a plurality of analog inputs. The circuit also comprises a reference source that provides a first reference.

The circuit comprises an analog-to-digital converter. The analog-to-digital converter receives the sequence of analog outputs and the first reference. The analog-to-digital converter provides a sequence of digital outputs.

The circuit comprises a control circuit. The control circuit actuates the select input to select the sequence of the analog outputs. The control circuit compares the sequence of digital outputs to a stored sequence of normal ranges that correspond with the digital outputs to provide an error output when at least one of the digital outputs is not in its normal range.

BRIEF DESCRIPTION OF THE DRAWINGS

FIGS. 8A, 8B, 8C illustrate circuits that can be used in analog systems to provide scaling, inversion or level shifting of an analog input.

DETAILED DESCRIPTION OF THE PREFERRED EMBODIMENTS

In the embodiments illustrated in FIGS. 2–8, a circuit includes a multiplexer (MUX), an analog-to-digital converter (A/D) and a processor (typically a microcontroller (uC)). The processor provides a digital output that represents analog inputs. In order to detect malfunctions, the processor compares a sequence of digital outputs from the analog-to-digital converter to a sequence of stored normal ranges that correspond with the digital outputs. The processor provides an error output when one of the digital outputs is outside its normal range. The arrangement provide detection of shorted analog input pins on the multiplexer, stuck bits of a select input of the multiplexer, some stuck bits at the analog-to-digital convert output and other malfunctions. The arrangement is especially useful in process control applications where Safety Instrumented Systems (SIS) standards are in use.

Figure 1:
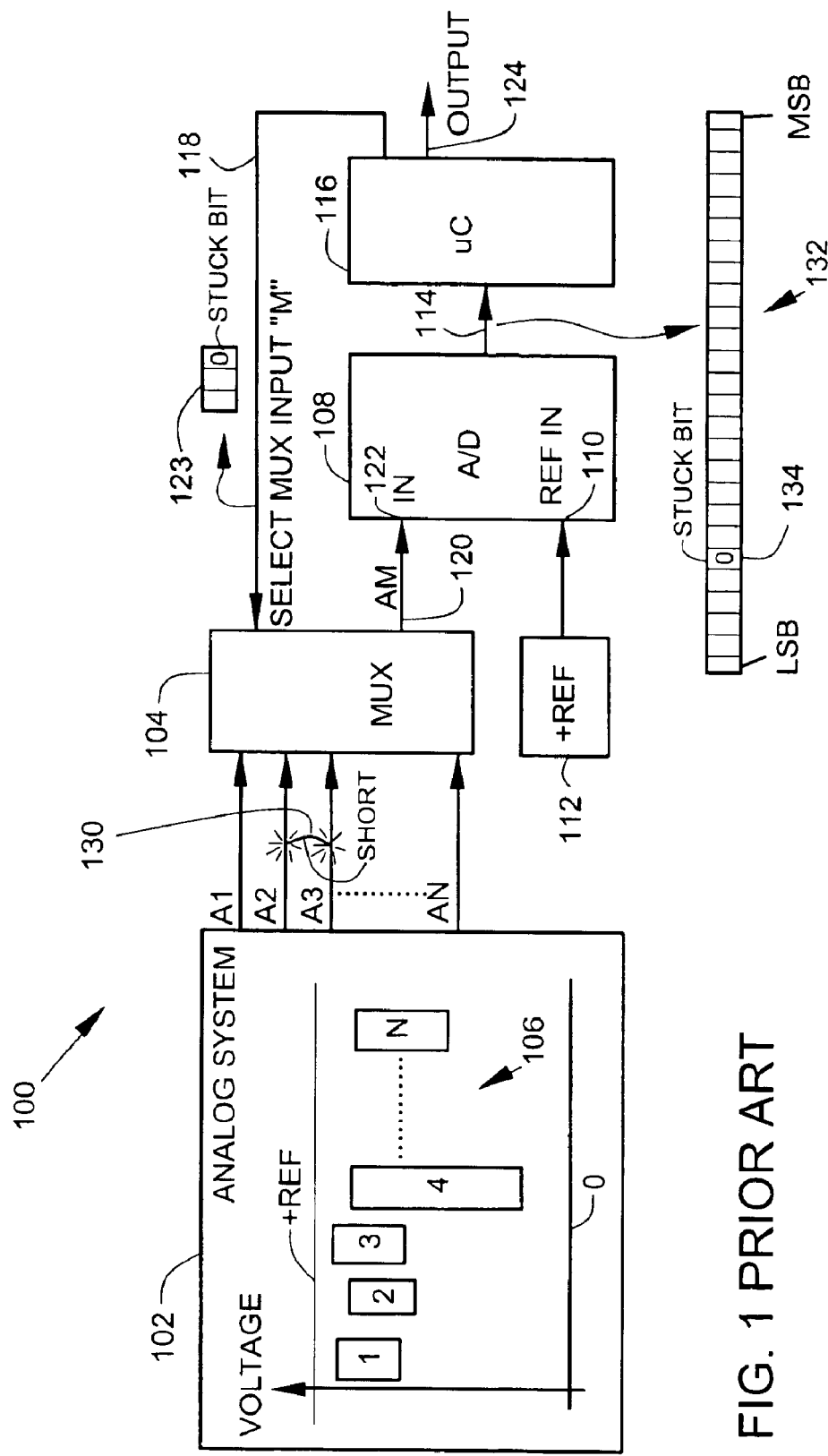
FIG. 1 illustrates a PRIOR ART analog-to-digital converter system.

FIG. 1 illustrates a PRIOR ART analog-to-digital converter system 100. An analog system 102 provides continuously variable (analog) voltages A1, A2, A3, ..., AN to a multiplexer 104. Each of the analog voltages Al, A2, A3, ..., AN has a normal voltage range indicated by vertical ranges of rectangles 1, 2, 3, ..., N at 106. The analog voltages A1, A2, A3, ..., AN can represent a process variable, a temperature, a voltage, a calibration pot setting and other analog variables. As part of the design process for the analog system 102, the analog voltages A1, A2, A3, ..., AN are scaled so that each analog voltage has a normal range of voltages that is within the input range of an analog-to-digital converter (A/D) 108. The input range of the A/D 108 ranges between zero (common) and a reference input 110 of the A/D 108. As part of the design process for the converter system 100, a reference 112 is selected which provides the desired input range (0 to +REF) to accommodate the normal ranges of all of the analog voltages A1, A2, A3, ..., AN. Various engineering tradeoffs are made in the design process in an effort to select scaling for each analog input and a reference voltage so that the input range maximum is near the upper limit (+REF) in order to provide high resolution at a digital output 114 of the A/D 108. As a result of these engineering tradeoffs, the ranges of the analog voltage at 106 tend to be all near the upper limit (+REF) and vertically overlapping one another on a voltage scale as illustrated.

A digital output 114 of the A/D is coupled to a microcontroller 116. The microcontroller 116 provides a digital output (M) 118 that couples to the Multiplexer (MUX) 104. The digital output (M) comprises a multibit digital word 123. The multiplexer 104 receives the digital output 118 and selects one output AM to connect to the multiplexer output 120 based on the digital word 123. The multiplexer output 120 couples to an analog input 122 of the A/D 108. The microcontroller 116 increments or steps the digital output M and obtains digital representations at output 114 for each of the relevant analog inputs A1, A2, A3, . . . , AN. The microcontroller 116 calculates desired outputs 124 as a function of the digitized analog inputs A1, A2, A3, . . . AN. Typically, the outputs 124 will represent process variables that are compensated for temperature, power supply voltages, calibration settings and the like that are obtained from the analog system 102.

Adjacent input pins on the multiplexer 104 are close together and subject to accidental or intermittent short circuiting by a short 130 during assembly or use of the multiplexer 104 on a printed wiring board. As explained above, analog voltages A1, A2, A3, . . . , AN tend to have voltage ranges that are crowded together and are overlapping. When two adjacent pins are shorted together, the voltage at the two shorted together pins is typically in both of the voltage ranges for the shorted pins, and there is no "out of range" reading to identify the fact that there is a short circuit. Analog voltages that are only slightly different than correct voltages may be converted by the A/D 108 and there will be no indication of the short circuit. One or more of the output 124 will provide inaccurate data, and this inaccurate data can cause a process control system to malfunction without adequate warning.

The digital output (M) 118 of the microcontroller 116 is a digital word 123 that includes a small number of bits. The number of bits generally corresponds to a binary word large enough to select an adequate number of multiplexer inputs. When the digital word is three bits, for example, up to 8 multiplexer inputs can be used. Each bit is generated by one or more switches internal to microcontroller 118. These internal switches are subject to failure, and when a switch fails, typically one bit 134 of the digital word 132 becomes stuck at either a high (1) level or a low (0) level. It is also possible for a bit to be stuck in select decoding circuitry in the multiplexer 104. These select bit malfunctions or failures can go unnoticed. The outputs 124 provide inaccurate data, and this inaccurate data can cause a process control system to malfunction without adequate warning.

The digital output 114 of the A/D 108 is a digital word 132 that includes a number of bits ranging from a least significant bit (LSB) to a most significant bit (MSB). The number of bits generally corresponds to the output resolution of the A/D. Each bit is generated by one or more switches internal to the A/D 108. These internal switches are subject to failure, and when a switch fails, typically one bit 134 of the digital word 132 becomes stuck at either a high (1) level or a low (0) level. This malfunction or failure can go unnoticed, particularly when the bit is nearer the least significant bit (LSB) because the analog inputs tend to be in overlapping ranges and will be approximately equally affected by the stuck bit. The outputs 124 provide inaccurate data, and this inaccurate data can cause a process control system to malfunction without adequate warning.

The problems with the A/D system 100 are overcome or improved as described below in connection with examples illustrated in FIGS. 2–8.

Figure 2B:
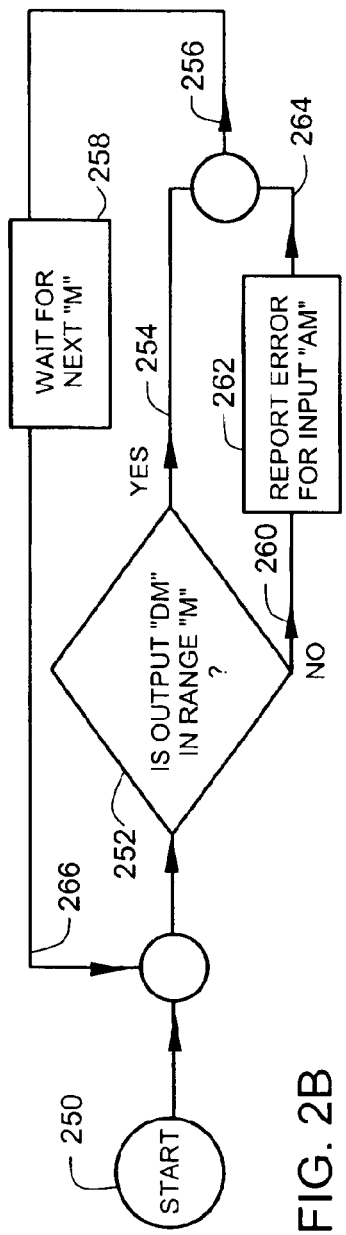
FIG. 2B illustrates a first simplified flow chart of a method of error checking in the circuit illustrated in FIG. 2A.
Figure 2A:
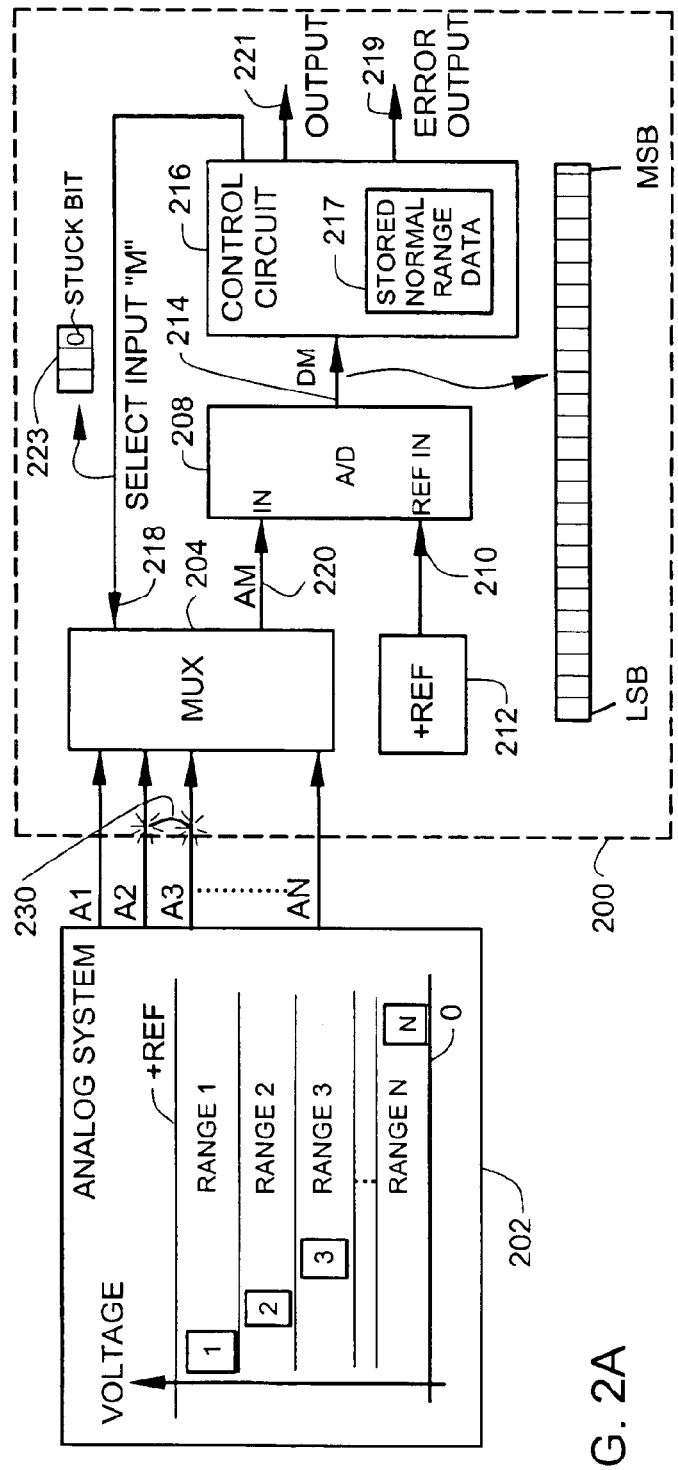
FIG. 2A illustrates a first embodiment of a circuit with a dynamically changing input range.

FIG. 2A illustrates a first embodiment of an circuit 200 with a dynamically changing input range and an error output 219. The circuit 200 is typically used to process analog variables in an industrial process variable transmitter such as the transmitter illustrated in FIG. 7, but can be used in a wide variety of other applications using multiplexed analog-to-digital conversion.

The circuit 200 receives a plurality of analog inputs A1, A2, A3, . . . AN from an analog system 202. Each analog input has a normal operating range (RANGE 1, RANGE 2, RANGE 3, . . . RANGE N) associated with it. The analog system 202 has been specially configured so that each analog input has a normal operating range that is different from the normal operating range of the other remaining analog inputs. In a preferred embodiment, the normal operating ranges of the analog inputs are non-overlapping. In a typical analog system 202, the analog inputs are conditioned by a combination of scaling, inversion or level shifting to provide a unique normal operating range for each analog input A. Examples of conditioning circuits are described below in connection with FIGS. 8A, 8B, 8C.

The circuit 200 includes a multiplexer (MUX) 204 that receives the analog inputs A1, A2, A3, AN. The multiplexer 204 has a select input 218 that selects one of the analog inputs A1, A2, A3, . . . AN to connect to a multiplexer output (AM) to provide a sequence of analog outputs 220. In a preferred arrangement, the multiplexer select input 218 is a multibit word 223 and is simply counted up (or down) to sample the analog inputs in numerical order. The multiplexer 204 preferably comprises an integrated circuit analog multiplexer, for example, Analog Devices AD7501 available from Analog Devices, Inc. of Norwood, Mass.

The circuit 200 also includes a reference source 212 that provides a first reference voltage to a reference input 210 of an analog-to-digital converter 208. In one preferred arrangement, a separate reference (such as a Zener diode or active reference) is provided in circuit 200. In another preferred embodiment, the reference source is simply a lead in the circuit 200 that connects to a shared reference (such as a Zener diode or active reference) that is part of the analog system 202. In yet another preferred arrangement, a reference source that is part of a commercial A/D circuit 208 is used.

The analog-to-digital converter (A/D) 208 receives the sequence of analog outputs (AM) 220. The A/D 208 has a reference input 210 that receives the first reference voltage from reference 212. The A/D 208 converts the sequence of analog inputs (AM) 220 to a corresponding sequence of digital outputs (DM) 214. The multiplexer 204 presents the sequence of analog outputs (AM) 220 in a numerical sequence, and the sequence of digital outputs (DM) is also presented in a numerical sequence. The individual digital outputs DM can be presented in either a serial or a parallel format, depending on the type of A/D converter that is used. In one preferred embodiment, an Analog Devices AD571 A/D converter is used, for example. A digital output (for each serial or parallel digital output in the sequence), includes a number of bits ranging from a least significant bit (LSB) to a most significant bit (MSB) as illustrated.

The circuit 200 includes a control circuit 216. The control circuit 216 actuates the select input 218 with a numerical sequence that selects the sequence of the analog outputs to be read by the control circuit 216. The control circuit 216 compares the sequence of digital outputs 214 to a stored sequence of normal ranges 217 that correspond with the digital outputs 214 to provide or actuate an error output 219 when at least one of the digital outputs 214 is not in its stored normal range 217. The control circuit 216 preferably comprises a microcontroller, for example, a National Semiconductor COP8SGE728M8. The error checking (normal range checking) runs in the background on the control circuit 216. The control circuit also provides a real time output 221 that represents some useful parameter of the analog system 202. In a typical transmitter application, the parameter of interest is a compensated pressure, temperature, or flow that is displayed or used for process control.

The arrangement illustrated in FIG. 2A provides for checking errors due to short circuits between analog inputs A1, A2, A3, . . . AN which all have unique, non-overlapping normal ranges. When two analog inputs are shorted together by short 230, the resulting voltage can only be in a single one of the normal ranges and cannot lie in two different ranges because the ranges are non-overlapping. This results in at least one, and sometimes both of the shorted analog inputs being detected as outside of normal range. Short-circuiting of two of the plurality of analog inputs causes at least one of the digital outputs to exceed its corresponding normal range.

The arrangement illustrated in FIG. 2A also provides for checking errors due to one of the bits of the select input multibit word 223 from the control circuit 216 being stuck. A bit is considered stuck when the bit remains at one logic state (0 or 1) continuously, or in other words is shorted to one of the power supply rails. When there is a stuck bit in the select input, the effect of the stuck bit is to present an incorrect (out of sequence) output at the digital output 214. There is a high probability that the control circuit 216 will detect that one or more out-of-sequence digital outputs is outside of the in-normal-sequence stored normal range, and provide an error output 219.

The arrangement illustrated in FIG. 2A also provides for checking at least some errors due to one of the output bits of the A/D 208 being stuck. A bit is considered stuck when the bit remains at one logic state (0 or 1) continuously, or in other words is shorted to one of the power supply rails. When there is a stuck bit, because the analog inputs are each in a different range, the effect of the stuck bit is at least some probability that the control circuit 216 will detect that one of the digital outputs is out of its corresponding stored normal range.

FIG. 2B illustrates a simplified flow chart example of background error checking in the system illustrated in FIG. 2A. Program flow starts at START 250 and proceeds to compare the current output DM (i.e., the output D when the select input is M) to the stored normal range data for range M at decision block 252. If the output DM is in the normal range, then program flow continues along lines 254, 256 to function block 258. At function block 258, the background program waits for the select input M to change to the next number. If the output DM is not in the normal range at decision block 252, then program flow continues along line 260 to function block 262 which actuates the error output 219 (FIG. 2A) and then continues along lines 264, 256 to the function block 258. When the select input M number changes, then program flow starts again and continues along lines 266 back to the decision block 252.

The arrangements illustrated in FIGS. 2A–2B have the advantage of a high certainty of detecting stuck bits of the select input and shorted pins of the multiplexer. There is also some possibility of detecting stuck bits at the A/D output. The problem of providing inaccurate data to a digital output is solved or improved by providing an error output that warns of stuck bits and shorted input pins.

Figure 3B:
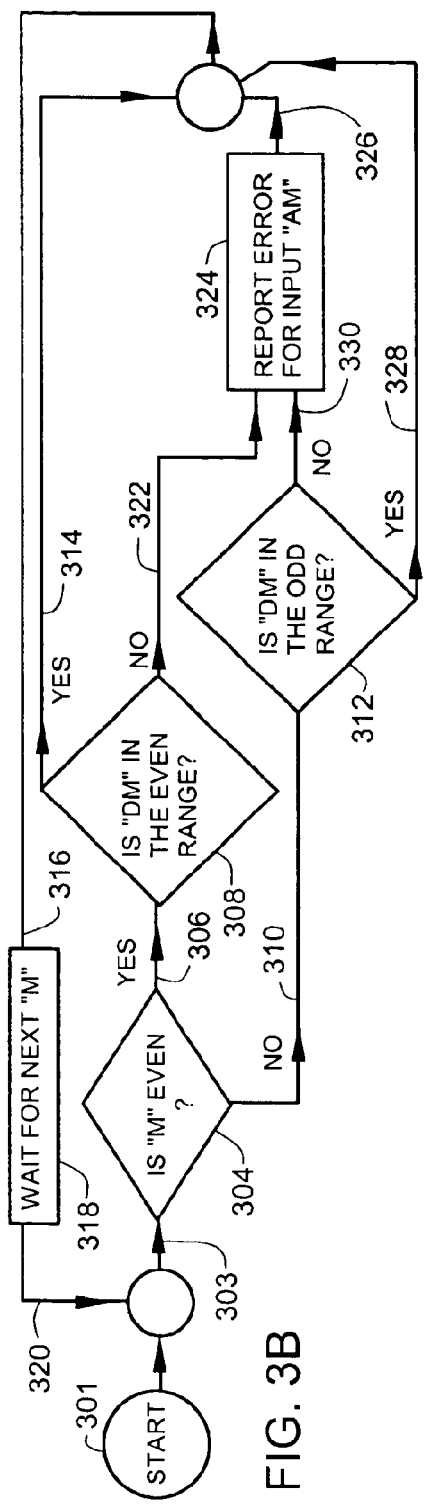
FIG. 3B illustrates a second simplified flow chart of a method of error checking in the circuit illustrated in FIG. 3A.
Figure 3A:
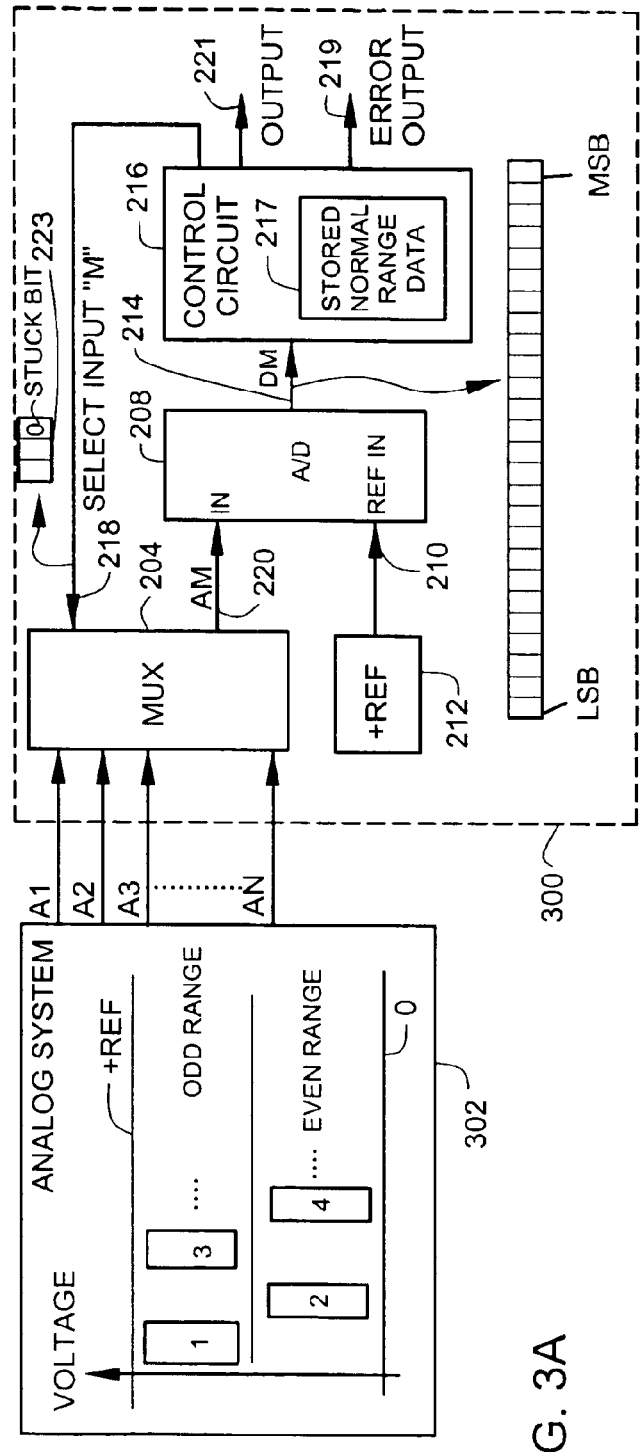
FIG. 3A illustrates a second embodiment of a circuit with a dynamically changing input range.

FIG. 3A illustrates a second embodiment of a circuit 300 with a dynamically changing input range and an error output 219. Reference numbers used in FIG. 3A that are the same as reference numbers used in FIG. 2A designate the same or similar features.

The circuit 300 receives a plurality of analog inputs A1, A2, A3, . . . AN from an analog system 302. Each analog input has a normal operating range (RANGE 1, RANGE 2, RANGE 3, . . . RANGE N) associated with it. The analog system 302 has been specially configured so that odd-numbered analog inputs (A1, A3, . . . ) are in an odd normal operating range, and even-numbered analog inputs (A2, A4, . . . ) are in an even normal operating range. In a preferred embodiment, the odd and even operating ranges of the analog inputs are non-overlapping and each of the two operating ranges extends over about one half of the input range of the A/D 208. In another preferred arrangement, there is a small voltage spacing between the even and odd ranges to increase the likelihood of detecting errors. In a typical analog system 302, the analog inputs are conditioned by a combination of scaling, inversion or level shifting so that alternately numbered analog inputs are in alternating normal operating ranges. Shorting between adjacent pins (one even, one odd) has a high probability of pulling one of the adjacent inputs outside of its normal range. A stuck bit at the select input 218 produces errors that can differ by a factor of two between even and odd outputs and the errors are thus easily recognized. Examples of conditioning circuits that can be used to scale, invert or level shift analog voltages are described below in connection with FIGS. 8A, 8B, 8C.

In circuit 300, the stored normal range data comprises even normal range data and odd normal range data. In other respects, the circuit 300 is similar to the circuit 200.

FIG. 3B illustrates an example of a simplified flow chart of background error checking useful in the system illustrated in FIG. 3A. Program flow begins at START 301 and continues along line 303 to decision block 304. At decision block 304, the current select input number "M" is tested to find out if it is even. If the input number "M" is even, then program flow continues along line 306 to decision block 308. If the number "M" is not even, then program flow continues along line 310 to decision block 312. It will be understood by those skilled in the art that, when there is a stuck bit in select input, the number "M" accessed by the software routine can differ from the number "M" at the select input.

At decision block 308, the A/D output DM is tested to find out if DM is in the even stored normal range. If DM is in the even stored normal range, then program flow continues along line 314 and 316 to action block 318. Action block 318 provides a wait until the value of M is updated, and then program flow continues along lines 320, 303 to start the process over for the next value of M.

If DM is not in the even stored normal range at decision block 308, then program flow continues along line 322 to action block 324. Action block 324 reports an error (actuates output 219 in FIG. 3A), and then program flow continues along lines 326, 316 to action block 318.

If DM is in the odd range at decision block 312, then program flow continues along lines 328, 316 to action block 318. If Dm is not in the odd range at decision block 312, then program flow continues along line 330 to action block 324.

The arrangements illustrated in FIGS. 3A–3B provide for error checking using only two stored normal ranges.

A single analog voltage, such as a power supply rail can be resistively scaled to provide one analog input in the upper (odd) range and another analog input in the lower (even) range. The control circuit 216 can compare the two readings and test for a constant ratio of resistive scaling as an additional error check.

Figure 4B:
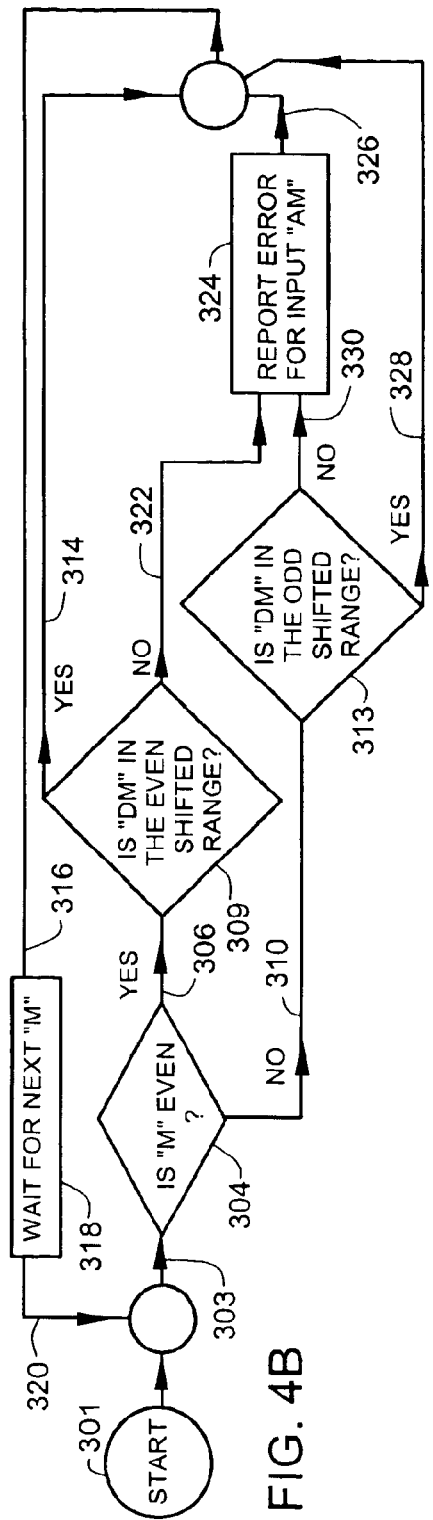
FIG. 4B illustrates a third simplified flow chart of a method of error checking in the circuit illustrated in FIGS. 4A, 5.
Figure 4A:
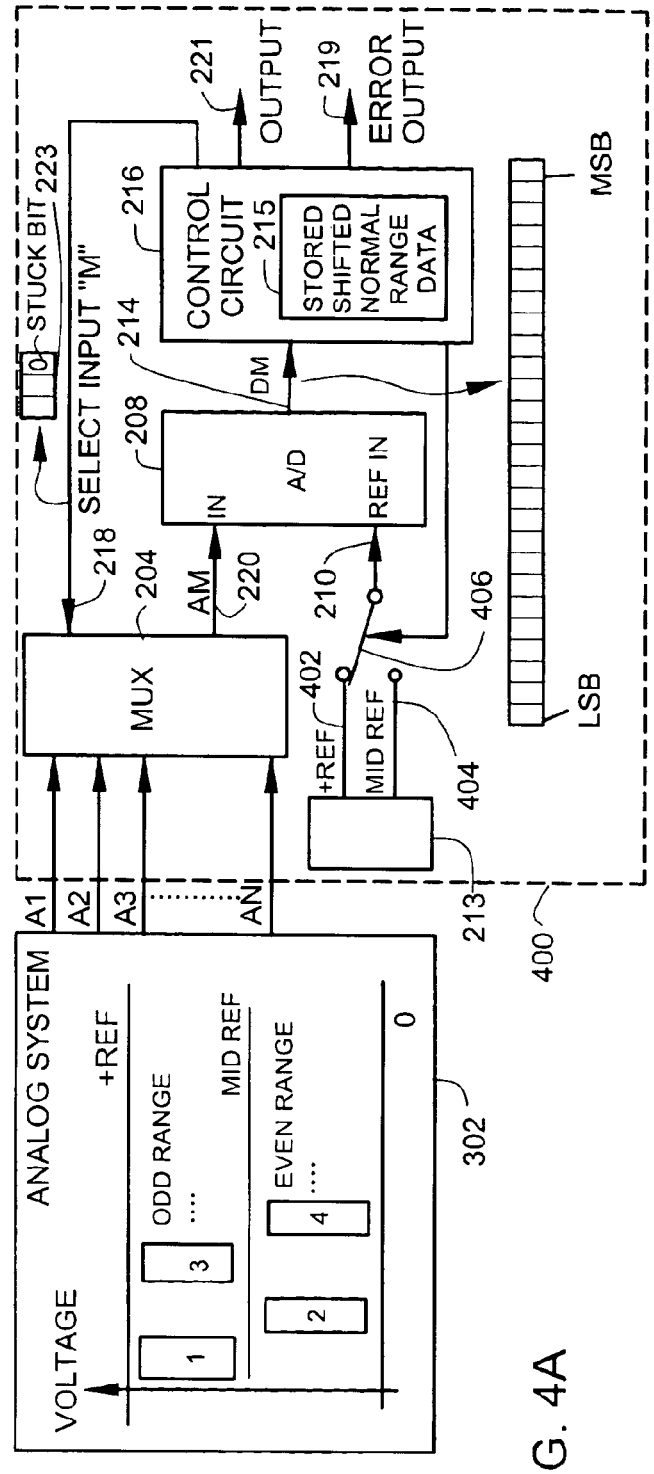
FIG. 4A illustrates a third embodiment of a circuit with a dynamically changing input range.

FIG. 4A illustrates a third embodiment of a circuit 400 with a dynamically changing input range and an error output 219. Reference numbers used in FIG. 4A that are the same as reference numbers used in FIG. 3A identify the same or similar features.

Circuit 400 in FIG. 4A comprises a first switch 406 that couples to a reference input 210 on the A/D 208. A reference source 213 generates a first reference 402 and also generates a second reference 404 that is different than the first reference 402.

A control circuit 216 controls the first switch 406 to couple the first reference 402 to the analog-to-digital converter 208 when an odd-numbered analog input (A1, A3, . . . ) is selected. The control circuit 216 controls the first switch 406 to couple the second reference 404 to the analog-to-digital converter when an even-numbered analog input (A2, A4, . . . ) is selected. The switching provided by the first switch 406 shifts the range of the output of the A/D converter 208. In simple terms, the output DM of the A/D converter is a digital word that is scaled to a product of voltage at the analog output AM divided by voltage at the reference input 210 times the count span of the A/D converter. Accordingly, data 215 in the control circuit 216 is stored shifted normal range data. The arrangement in FIG. 4A provides enhanced A/D converter resolution for the lower range while still providing the error detection between adjacent pins of the analog inputs. In other respects, the circuit 400 of FIG. 4A is similar to the circuit 300 of FIG. 3.

FIG. 4B illustrates a simplified flow chart of error checking in the system illustrated in FIG. 4A. Reference numbers used in FIG. 4B that are the same as reference numbers used in FIG. 3B identify the same or similar features. In FIG. 4B, decision blocks 309, 313 test for DM to be in shifted ranges rather than ranges (FIG. 3B). In other respects, the flow chart in FIG. 4B is similar to the flow chart if FIG. 3B.

The arrangements illustrated in FIGS. 4A–4B provide for analog inputs in both the odd and even ranges to use a full output range of the A/D converter 208 because the reference input shifts to boost the lower valued analog inputs in the lower (even) range.

Figure 5:
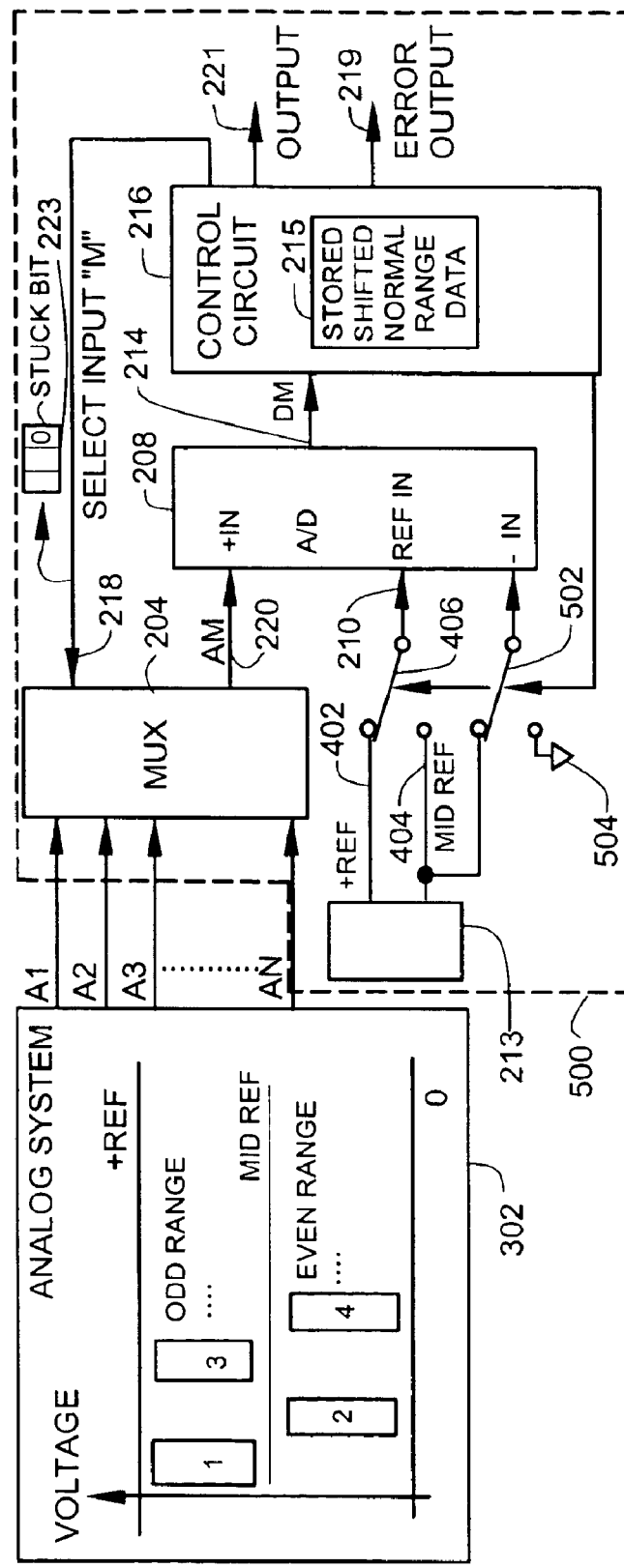
FIG. 5 illustrates a fourth embodiment of a circuit with a dynamically changing input range.

FIG. 5 illustrates a fourth embodiment of a circuit 500 with a dynamically changing input range and an error output 219. Reference numbers used in FIG. 5 that are the same as reference numbers used in FIG. 4A identify the same or similar features.

In FIG. 5, a circuit 500 comprises a second switch 502. The A/D converter 208 is provided with differential analog inputs +IN and −IN. The second switch 502 is coupled to the −IN differential input and the analog input AM is coupled to +IN differential input. The control circuit 216 controls the second switch 502 to connect a selected one of the second reference 404 and a common conductor 504 (zero volts) to the −IN differential input. The switches 406 and 502 are operated in synchronization so that both the upper and lower limits of the range of the A/D converter 208 can be shifted. This arrangement allows enhanced error detection while retaining high A/D converter resolution. An odd range input value will produce a maximum count A/D output value DM if input into an even range switch configuration. Likewise, an even range input value will produce a minimum count A/D input value DM if input into an odd range switch configuration. In other respects, the circuit 500 in FIG. 5 is similar to the circuit 400 in FIG. 4A.

Figure 6:
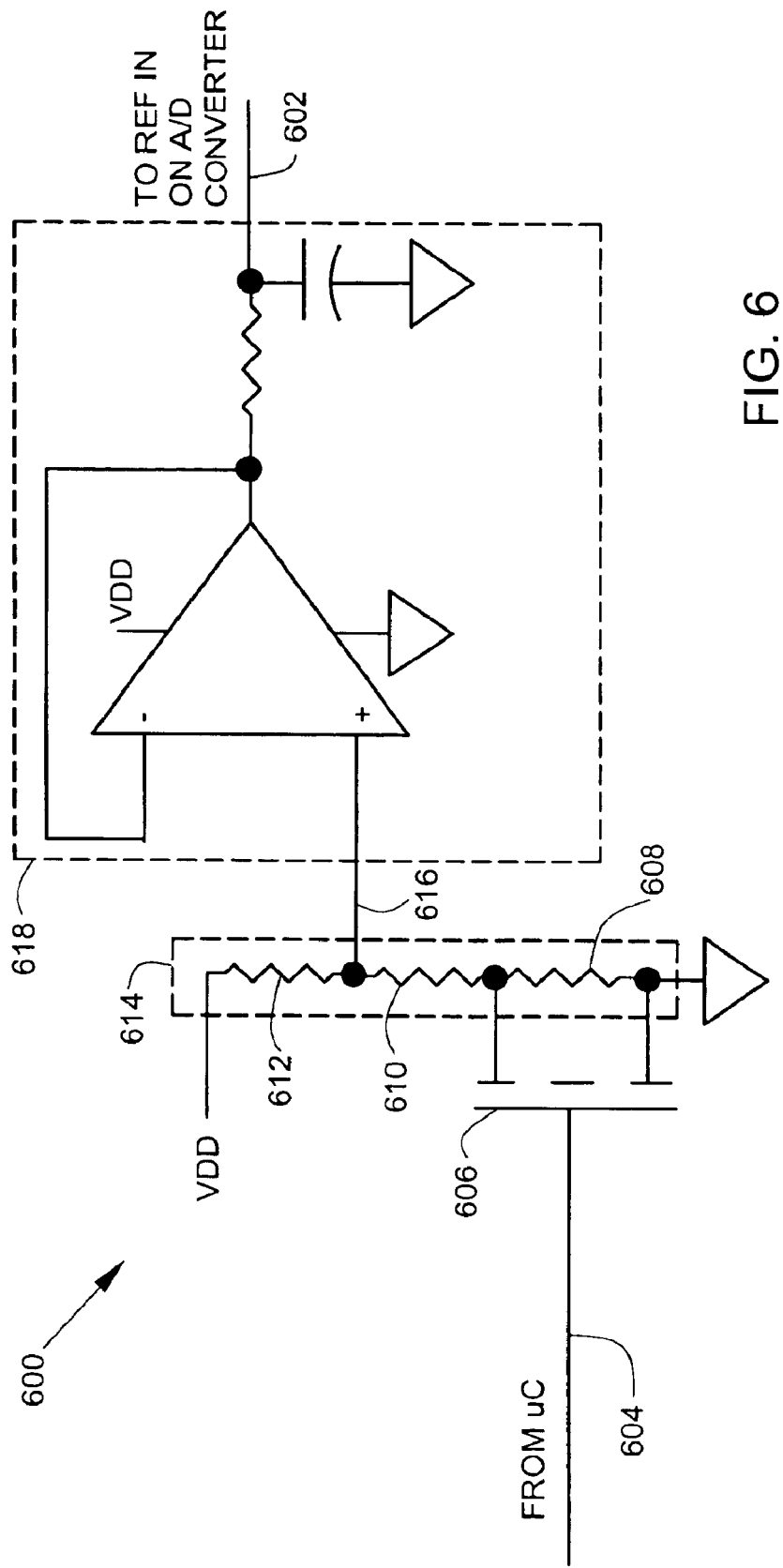
FIG. 6 illustrates an embodiment of a reference circuit.

FIG. 6 illustrates an embodiment of a reference switching circuit 600 that provides a selectable level of reference voltage 602 to a reference input on an A/D converter. Selection of the level is controlled by a control line 604 from a control circuit such as a microcontroller.

The control line 604 activates a switch 606 to short out a resistor 608. Resistor 608 is in a resistive voltage divider 614 along with resistors 610, 612. The resistive voltage divider 614 provides a reference voltage on line 616 to a buffer circuit 618. The reference switching circuit 600 can be used in place of the reference 213 and the switch 406 in FIG. 4A, for example.

The reference switching circuit 600 is controlled to generate the first reference at a first level when an odd-numbered analog input is selected, and controlled to generate the first reference at a second level when an even-numbered analog input is selected.

Figure 7:
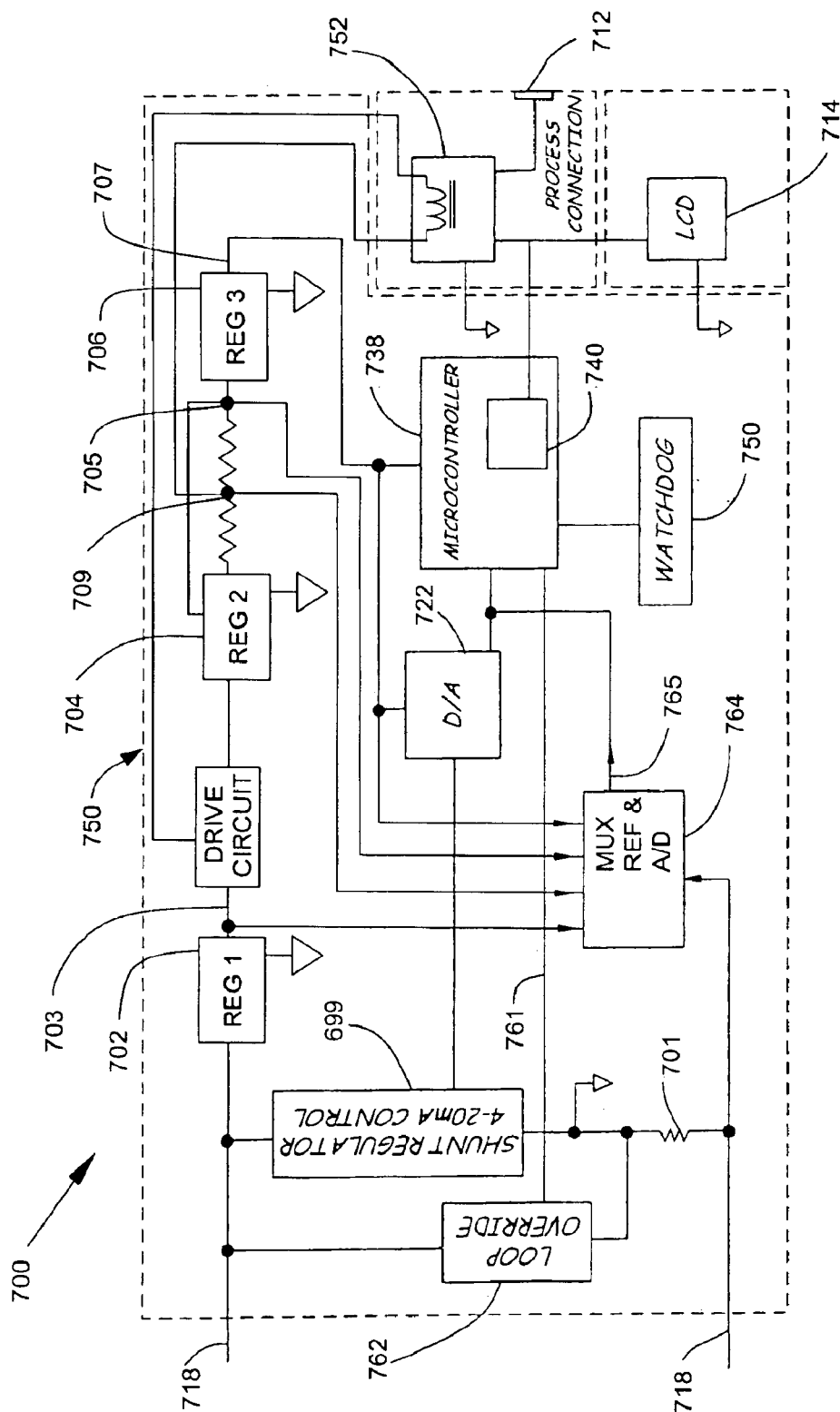
FIG. 7 illustrates a block diagram of a transmitter circuit in which circuits and methods such as described above in FIGS. 2–6 can be used.

FIG. 7 is a block diagram showing one example of a transmitter circuit 700 in which circuits and software such as described above in FIGS. 2–6 can be used. In FIG. 7, feature module electronics 750 is shown coupled to two wire process control loop 718 through a shunt regulator 699 and a loop feedback resistor 701. A series of cascaded voltage regulators 702, 704, 706 couple power from the loop 718 to the feature module electronics 750 and also to sensor module electronics 752. Sensor module electronics 752 is also shown coupled to a process variable through a process variable sensor 712. An optional output display 714 is also shown.

Loop override circuitry 762 serves as an error output and is partially implemented in microcontroller 738 which couples to a digital to analog (D/A) converter 722 and a multiplexed converter circuit 764 that includes an analog-to-digital (A/D) converter, multiplexer and reference as described above in connection with FIGS. 2–5. The multiplexed converter circuit 764 is configured to measure the sense voltage on resistor 701 (sensing loop current) and also senses regulated power supply voltages at nodes 703, 705, 707. The multiplexed converter circuit 764 also measures a voltage at node 709 which is representative of power supply current from voltage regulator 704.

In operation, the microcontroller 738 is configured to control the current I through loop 718, and any digital data modulated onto that current, using D/A 722 and shunt regulator 699. The multiplexed converter circuit 764 provides outputs 765 (comparable to outputs 214 in FIGS. 2–5) that represents the various analog voltages that are sensed. The multiplexed converter circuit 764 can also be connected to other voltages or components within transmitter 700. The microcontroller 738 includes a memory 740 which stores normal range data (comparable to data 215, 217 in FIGS. 2–5) used to detect errors such as shorted pins or a stuck select bit or output bit as described above in connection with FIGS. 2–5.

Upon the detection of a short circuit or stuck bit, the microcontroller 738 transmits an alarm signal on line 761 to activate loop override circuitry 762. The current I flowing through loop 718 is then set to a fixed current level. In some embodiments, circuitry within the device can be disconnected or shut off in order to provide enough power to other circuitry to provide a desired output. One technique to provide a loop override is to disconnect the device, or otherwise take the device offline from the process control loop. The change in loop current indicates a failure in the transmitter 700 to the loop 718 and this can be used by a control system connected to the loop to take action to shut down a controlled process using a Safety Instrumented System (SIS).

FIG. 7 also illustrates an optional watch dog circuit 750 coupled to microcontroller 738. The watch dog circuit 750, when used, must be periodically triggered by microcontroller 738. If microcontroller 738 stops triggering watch dog circuit 750, it can be assumed that a failure has occurred.

Examples include, but are not limited to, improper program flow, microprocessor or memory failure, clock errors, etc. If watch dog circuit 750 is not triggered, watch dog circuit 750 sends a signal to loop override circuitry 762 to cause loop override circuitry 762 to drive an alarm current level on the process loop 718.

FIGS. 8A, 8B, BC illustrate circuits that can be used in analog systems to provide scaling, inversion or level shifting of an analog input. FIG. 8A illustrates a conditioning circuit in which an analog voltage 800 from an analog system is amplified by an amplifier 802 to provide a scaled output 804 which can be coupled to an input of an A/D converter. FIG. 8B illustrates a conditioning circuit in which an analog voltage 810 from an analog system is scaled down by a factor controlled by a resistive voltage divider to provide a scaled down output 814 that can be coupled to an input of an A/D converter. FIG. 8C illustrates a conditioning circuit in which an analog voltage 820 is coupled to an inverting input 821 of an amplifier 822 via a resistor. A reference voltage 824 is also coupled to the inverting input 821 via a resistor. The arrangement shown in FIG. 8C provides scaling, inversion and level shifting by the selection of resistor values and reference voltage 824 to provide an output 826 that can be coupled to an input of an A/D converter.

Features described in connection with one embodiment can be appropriately applied to other embodiments. Although the present invention has been described with reference to preferred embodiments, workers skilled in the art will recognize that changes may be made in form and detail without departing from the scope of the invention.

What is claimed is:

1. A circuit, comprising:
    a multiplexer having a select input and a sequence of analog outputs that are selected from a plurality of analog inputs provided by an analog system;
    a reference source providing a first reference;
    an analog-to-digital converter receiving the sequence of analog outputs and the first reference, and providing a sequence of digital outputs; and
    a control circuit actuating the select input to select the sequence of the analog outputs, the control circuit comparing the sequence of digital outputs to a stored sequence of normal ranges that correspond with the digital outputs to provide an error output when at least one of the digital outputs is not in its normal range, the control circuit further providing a real time output that represents a useful parameter of the analog system.

2. The circuit of claim 1 wherein at least two of the normal ranges are non-overlapping.

3. The circuit of claim 2 wherein short-circuiting of two of the plurality of analog inputs causes at least one of the digital outputs to exceed its corresponding normal range.

4. The circuit of claim 2 wherein the select input comprises a digital word with a series of bits, and wherein a sticking of one of the series of bits causes at least one of the digital outputs to exceed its corresponding normal range.

5. The circuit of claim 2 wherein the sequence of digital outputs comprises digital words with a series of bits, and wherein a sticking of one of the bits causes at least one of the digital outputs to exceed its corresponding normal range.

6. The circuit of claim 1, wherein each normal range is different and does not overlap another normal range.

7. The circuit of claim 1, wherein:
    the normal ranges comprise an odd range and an even range, and
    the plurality of analog inputs are connected to the multiplexer in a numbered sequence such that odd-numbered analog inputs generate digital outputs that are in the odd range and even-numbered analog inputs generate digital outputs that are in the even range.

8. The circuit of claim 7, further comprising:
    a first switch;
    wherein the reference source generates a second reference that is different than the first reference; and
    wherein the control circuit controls the first switch to couple the first reference to the analog-to-digital converter when an odd-numbered analog input is selected, and controls the first switch to couple the second reference to the analog-to-digital converter when an even-numbered analog input is selected.

9. The circuit of claim 8, further comprising:
    a second switch; and
    wherein the analog-to-digital converter comprises first and second differential inputs, the analog output is connected to the first differential input; and the control circuit controls the second switch to connect a selected one of the second reference and a common conductor to the second differential input.

10. The circuit of claim 1 wherein the control circuit controls the reference source to generates the first reference at a first level when an odd-numbered analog input is selected, and to generate the first reference at a second level when an even-numbered analog input is selected.

11. A method of detecting an error, comprising:
    providing a plurality of analog inputs generated by an analog system;
    generating a sequence of analog outputs that are selected from the plurality of analog inputs as a function of a select input;
    providing a first reference;
    receiving the sequence of analog outputs and the first reference, and providing a sequence of digital outputs that represent the sequence of analog outputs; and
    actuating the select input to select the sequence of the analog outputs;
    comparing the sequence of digital outputs to a stored sequence of normal ranges that correspond with the digital outputs to provide an error output when at least one of the digital outputs is not in its normal range; and
    providing a real time output that represents a useful parameter of the analog system.

12. The method of claim 11 wherein at least two of the normal ranges do not overlap one another.

13. The method of claim 12 wherein at least one of the analog inputs exceeds its corresponding normal range when two of the plurality of analog inputs short circuit to one another.

14. The method of claim 12 wherein at least one of the digital outputs exceeds its corresponding normal range when one output bit in the select input sticks.

15. The method of claim 12 wherein at least one of the digital outputs exceeds its corresponding normal range when one output bit in the digital outputs sticks.

16. The method of claim 11, wherein each normal range differs from the other normal ranges and does not overlap another normal range.

17. The method of claim 11, further comprising:
    providing the normal ranges as an odd range and an even range, and connecting the plurality of analog inputs to a multiplexer in a numbered sequence such that odd-numbered analog inputs generate digital outputs that are in the odd range and even-numbered analog inputs generate digital outputs that are in the even range.

18. The method of claim 17, further comprising:

providing a first switch;

generating a second reference that is different than the first reference; and controlling the first switch to couple the first reference to an analog-to-digital converter when an odd-numbered analog input is selected, and controlling the first switch to couple the second reference to the analog-to-digital converter when an even-numbered analog input is selected.

19. The method of claim 18, further comprising:

providing a second switch;

providing first and second differential inputs on the analog-to-digital converter, connecting the analog output to the first differential input; and controlling the second switch to connect a selected one of the second reference and a common conductor to the second differential input.

20. The method of claim 11, further comprising:

controlling a reference source to generates the first reference at a first level when an odd-numbered analog input is selected, and controlling the reference source to generate the first reference at a second level when an even-numbered analog input is selected.

21. A circuit, comprising:

a multiplexer having a select input and a sequence of analog outputs that are selected from a plurality of analog inputs provided by an analog system;

a reference source providing a first reference;

an analog-to-digital converter receiving the sequence of analog outputs and the first reference, and providing a sequence of digital outputs; and means for actuating the select input to select the sequence of the analog outputs, and for comparing the sequence of digital outputs to a stored sequence of normal ranges that correspond with the digital outputs to provide an error output when at least one of the digital outputs is not in its normal range; and means for providing a real time output that represents a useful parameter of the analog system.

22. The circuit of claim 21 wherein at least two of the normal ranges are non-overlapping.

23. The circuit of claim 22 wherein short-circuiting of two of the plurality of analog inputs causes at least one of the digital outputs to exceed its corresponding normal range.

24. The circuit of claim 22 wherein the select input comprises a digital word with a series of bits, and wherein a sticking of one of the bits causes at least one of the digital outputs to exceed its corresponding normal range.

25. The circuit of claim 22 wherein the sequence of digital outputs comprises digital words with a series of bits, and wherein a sticking of one of the bits causes at least one of the digital outputs to exceed its corresponding normal range.

* * * * *